(12) United States Patent
Ha et al.

(10) Patent No.: US 12,507,352 B2
(45) Date of Patent: Dec. 23, 2025

(54) DISPLAY DEVICE

(71) Applicant: Samsung Display Co., Ltd., Yongin-si (KR)

(72) Inventors: Seunghwa Ha, Cheongju-si (KR); Doyoub Kim, Suwon-si (KR); Seung-Ho Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/858,410

(22) Filed: Jul. 6, 2022

(65) Prior Publication Data
US 2023/0113544 A1    Apr. 13, 2023

(30) Foreign Application Priority Data
Oct. 12, 2021  (KR) ........................ 10-2021-0135284

(51) Int. Cl.
*B32B 3/26*    (2006.01)
*B32B 3/30*    (2006.01)
(Continued)

(52) U.S. Cl.
CPC ........... *H05K 5/0018* (2022.08); *B32B 3/266* (2013.01); *B32B 3/30* (2013.01); *B32B 7/12* (2013.01);
(Continued)

(58) Field of Classification Search
CPC ........ H05K 5/0018; B32B 3/266; B32B 3/30; B32B 7/02; B32B 7/12; B32B 15/18; B32B 17/10; B32B 27/20; B32B 27/281; B32B 27/36; B32B 27/34; B32B 27/32; B32B 2262/101; B32B 2262/106;
(Continued)

(56) References Cited

U.S. PATENT DOCUMENTS 9,348,362 B2 * 5/2016 Ko ........................ G06F 1/1601
10,845,696 B2  11/2020 Song et al.
(Continued)

FOREIGN PATENT DOCUMENTS

| KR | 1020140101295 A | 8/2014 |
| KR | 1020190049242 A | 5/2019 |
| KR | 1020200063801 A | 6/2020 |

*Primary Examiner* — Megha M Gaitonde
(74) *Attorney, Agent, or Firm* — CANTOR COLBURN LLP

(57) ABSTRACT

Provided is a display device including a display module having a first non-folding region, a second non-folding region, and a folding region disposed between the first non-folding region and the second non-folding region, and a plate disposed below the display module, and having a folding part overlapping the folding region and to be folded with respect to a folding axis extending in a first direction and first and second support parts spaced apart from each other with the folding part disposed therebetween. The folding part includes a first curved portion and second curved portions spaced apart from the first curved portion and disposed between the first curved portion and the first support part and between the first curved portion and the second support part, and the first curved portion has openings passing therethrough and the second curved portions each have at least first groove by being partially recessed.

15 Claims, 22 Drawing Sheets

(51) Int. Cl.
- *B32B 7/12* (2006.01)
- *B32B 15/18* (2006.01)
- *B32B 17/10* (2006.01)
- *B32B 27/28* (2006.01)
- *B32B 27/36* (2006.01)
- *H04M 1/02* (2006.01)
- *H05K 5/00* (2006.01)

(52) U.S. Cl.
CPC .............. *B32B 15/18* (2013.01); *B32B 17/10* (2013.01); *B32B 27/281* (2013.01); *B32B 27/36* (2013.01); *H04M 1/0214* (2013.01); *H04M 1/0268* (2013.01); *B32B 2262/101* (2013.01); *B32B 2262/106* (2013.01); *B32B 2457/20* (2013.01)

(58) Field of Classification Search
CPC ........ B32B 2457/20; B32B 2307/7376; B32B 2307/546; H04M 1/0214; H04M 1/0216; H04M 1/0268; G09F 9/301; G09F 9/335; H10K 50/84; H10K 77/111; Y10T 428/24273; Y10T 428/24298–24331; Y10T 428/24479; Y10T 428/24521; Y10T 428/24595; Y10T 428/24612; Y10T 428/2462; Y10T 428/24942; Y10T 428/2495; Y10T 428/24992
USPC ....... 428/131, 134–138, 156, 161, 170, 172, 428/173, 212, 213, 215, 220, 218
See application file for complete search history.

(56) References Cited

U.S. PATENT DOCUMENTS

| | | |
|---|---|---|
| 10,866,618 B2 | 12/2020 | Yeom |
| 2017/0294495 A1* | 10/2017 | Shyu .................... H10K 77/111 |
| 2019/0132947 A1 | 5/2019 | Koo et al. |

\* cited by examiner

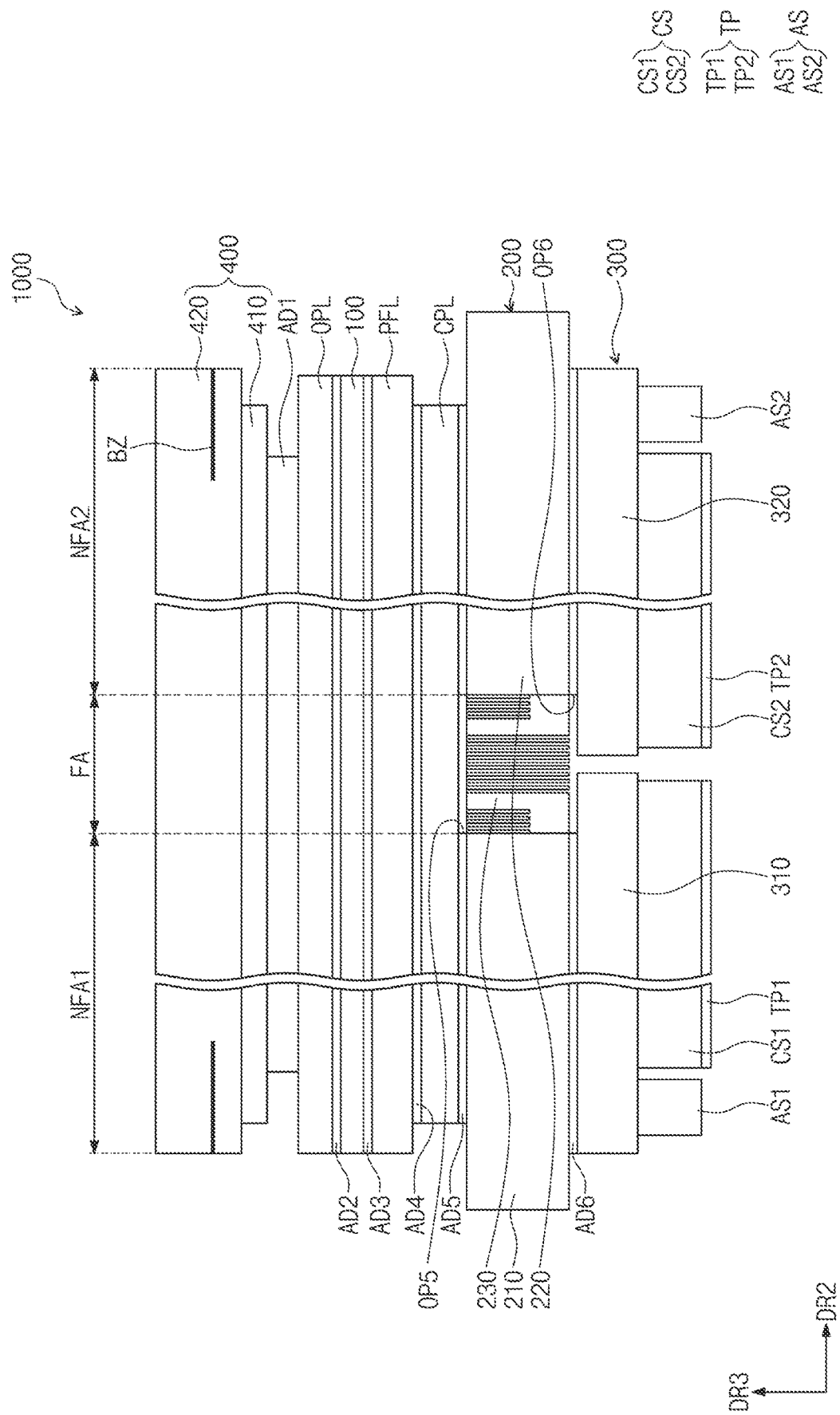

DISPLAY DEVICE

This application claims to Korean Patent Application No. 10-2021-0135284, filed on Oct. 12, 2021, and all the benefits accruing therefrom under 35 U.S.C. § 119, the entire contents of which are hereby incorporated by reference.

BACKGROUND

(1) Field

The present disclosure herein relates to a display device, and more particularly, to a foldable display device.

(2) Description of the Related Art

A display device includes a display region activated in response to an electrical signal. A display device may sense an input applied from outside the display device, via a display region, and provide information to outside the display device by displaying various images. As display devices in various forms have been developed, display regions having various shapes are implemented.

SUMMARY

The present disclosure provides a display device having a folding region with improved flexibility and including a support member with a rigidity.

An embodiment provides a display device which includes a display module having a first non-folding region, a second non-folding region, and a folding region between the first non-folding region and the second non-folding region, and a plate below the display module, and including a folding part which overlaps the folding region and is to be folded with respect to a folding axis extending in a first direction, and first and second support parts which are spaced apart from each other with the folding part therebetween. The folding part includes a first curved portion and second curved portions spaced apart from the first curved portion, and between the first curved portion and the first support part and between the first curved portion and the second support part, the first curved portion has openings passing therethrough, the second curved portions each have at least one first groove formed by being partially recessed, and an area ratio of the second curved portions in the folding part is about 10% to about 35%.

In an embodiment, a width of each of the first curved portion in a second direction crossing the first direction may be about two to about four times a width of each of the second curved portions.

In an embodiment, the first grooves may be recessed in a direction from a first surface of the folding part facing the display module towards a second surface facing the first surface.

In an embodiment, the second curved portions each may include second grooves alternately arranged with the first grooves and formed by being partially recessed in a direction from the second surface towards the first surface.

In an embodiment, a depth of each of the first grooves from the first surface may be about 70% or less of a thickness of the plate, and a depth of each of the second grooves from the second surface may be about 50% or less of the thickness of the plate.

In an embodiment, a depth of each of the first grooves from the first surface may be about 50% or less of a thickness of the plate, and a depth of each of the second grooves from the second surface may be about 70% or less of the thickness of the plate.

In an embodiment, the folding part may include flat portions between the first curved portion and the second curved portions, and each of the flat portions may include additional grooves formed by being partially recessed.

In an embodiment, the additional grooves and the first grooves may be recessed from the same surface among surfaces of the folding part.

In an embodiment, the display device further include resin patterns in the additional grooves.

In an embodiment, the additional grooves and the first grooves may be recessed from different surfaces among surfaces of the folding part.

In an embodiment, the display device further include resin patterns in the additional grooves.

In an embodiment, the second curved portions each include one first groove.

In an embodiment, the plate includes either of stainless steel or a reinforced fiber composite material.

In an embodiment, the first curved portion may have a greater curvature than the second curved portions.

In an embodiment, the plate may have a thickness of about 80 μm to about 200 μm.

In an embodiment, a display device includes a display module unfolded in a first mode and folded in a second mode and a plate below the display module, and having a folding part folded with respect to a folding axis extending in a first direction and first and second support parts spaced apart from each other with the folding part therebetween. In the second mode, the folding part includes a first curved portion having a first curvature and second curved portions spaced apart from the first curved portion, adjacent to the first and second support parts, respectively, and having a second curvature greater than the first curvature, the first curved portion has openings passing therethrough, the second curved portions each have at least one first groove formed by being partially recessed, and an area ratio of the second curved portions in the folding part is about 15% to about 35%.

In an embodiment, the first grooves may be recessed in a direction from a first surface of the folding part facing the display module towards a second surface facing the first surface.

In an embodiment, the second curved portions may each further include second grooves alternately arranged with the first grooves and formed by being partially recessed in a direction from the second surface towards the first surface.

In an embodiment, a depth of each of the first grooves from the first surface may be different from a depth of each of the second grooves from the second surface.

In an embodiment, the folding part may include flat portions between the first curved portion and the second curved portions and the flat portions include additional grooves formed by being partially recessed.

In an embodiment, the flat portions further may include resin patterns in the additional grooves.

In an embodiment, a width of the first curved portion in a second direction crossing the first direction may be about two to about four times a width of each of the second curved portions.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 3 is a cross-sectional view of a display device according to an embodiment of the invention;

DETAILED DESCRIPTION

Figure 1A:
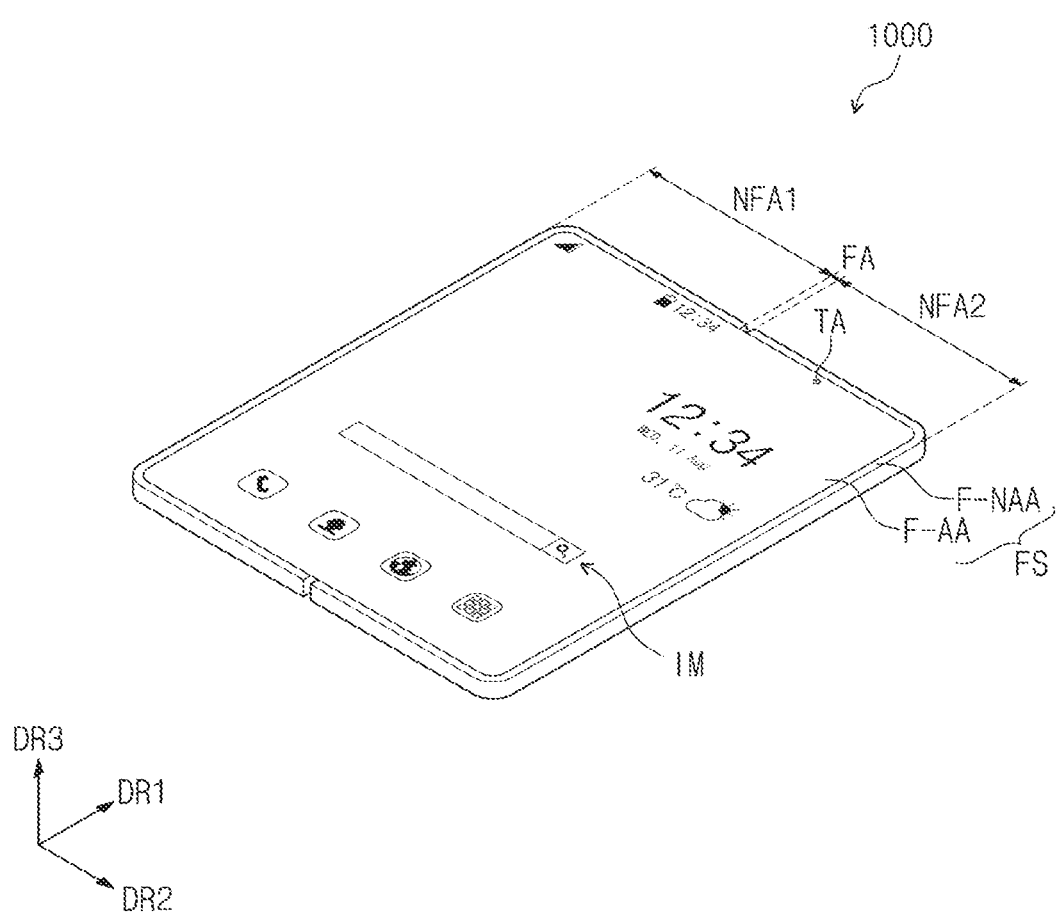
FIGS. 1A to 1D are perspective views of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, etc.) is referred to as being related to another element such as being "on", "connected to" or "coupled to" another element, it can be directly disposed on, connected or coupled to the other element or intervening elements may be present therebetween. In contrast, when an element (or a region, a layer, a portion, etc.) is referred to as being related to another element such as being "directly on", "directly connected to" or "directly coupled to" another element, no other element or intervening elements are therebetween.

Like reference numerals or symbols refer to like elements throughout. In addition, in the drawings, the thicknesses, the ratios, and the dimensions of elements are exaggerated for effective explanation of technical contents.

It will be understood that, although the terms first, second, etc., may be used herein to describe various elements, the elements should not be limited by these terms. These terms are exclusively used to distinguish one element from another element. For example, a first element could be termed as a second element, and similarly, the second element could be termed as the first element.

The terminology used herein is for the purpose of describing particular embodiments only and is not intended to be limiting. The singular forms are intended to include the plural forms as well, unless the context clearly indicates otherwise. For example, as used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes all combinations of one or more of the associated elements. As used herein, a reference number may indicate a singular element or a plurality of the element. For example, a reference number labeling a singular form of an element within the drawing figures may be used to reference a plurality of the singular element within the text of specification.

In addition, the terms "below", "beneath", "on" and "above" are used for explaining the relation of elements illustrated in the drawings. The terms are relative concept and are explained based on the direction illustrated in the drawing.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. Furthermore, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be explained with reference to the accompanying drawings.

Figure 1B:
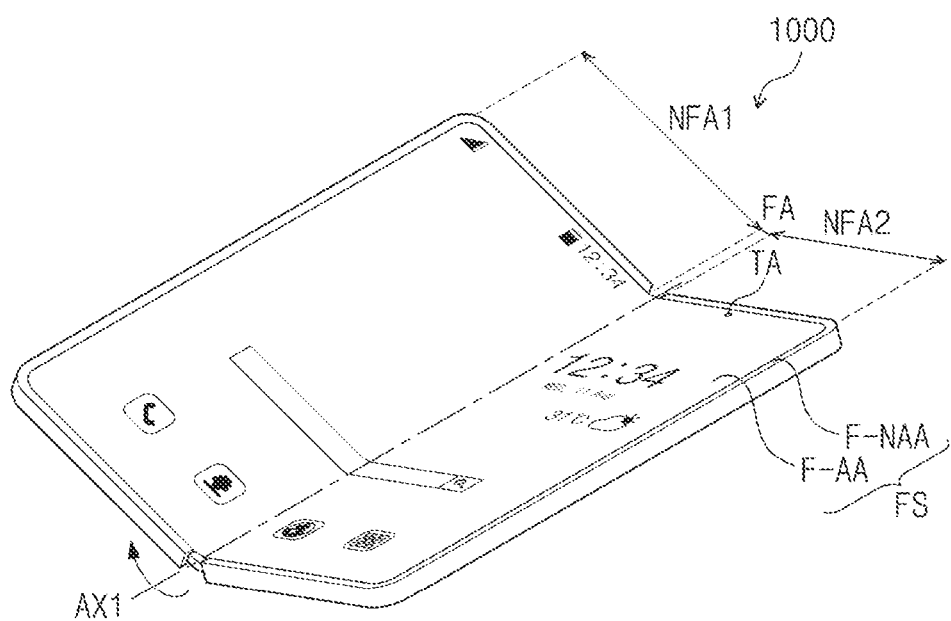
Figure 1C:
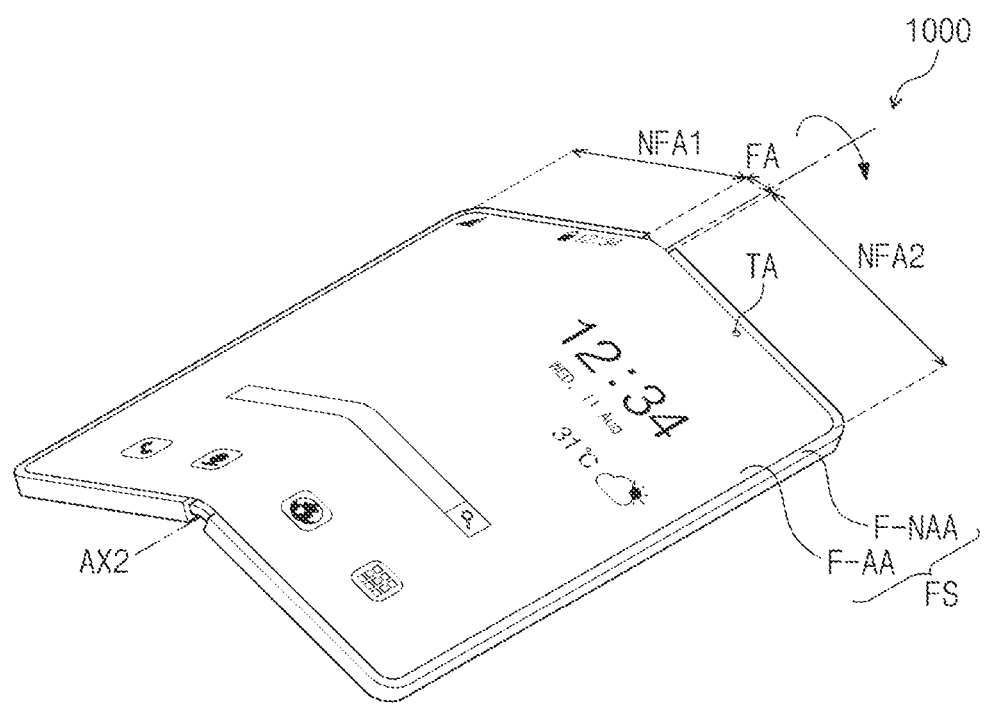
Figure 1D:
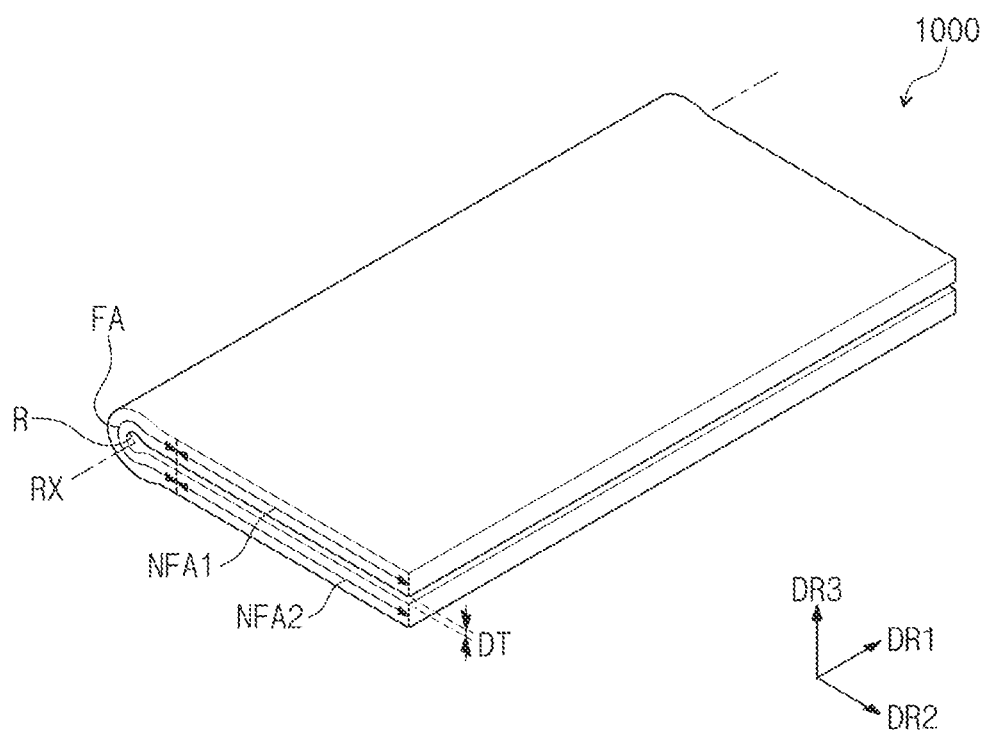

FIGS. 1A to 1D are perspective views of a display device 1000 according to an embodiment of the invention. FIG. 1A is a perspective view illustrating a display device 1000 which is unfolded or flat (e.g., in an unfolded state). FIGS. 1B and 1C are perspective views illustrating a display device 1000 which is being folded, and FIG. 1D is a perspective view illustrating a display device 1000 which is folded (e.g., in a folded state).

The display device 1000 illustrated in FIGS. 1A to 1D may be a device activated in response to an electrical signal. The display device 1000 may include various embodiments. For example, the display device 1000 may include a tablet personal computer (PC), a laptop computer, a computer, a smart television (TV), and the like. In this embodiment, the display device 1000 is exemplarily illustrated as a smartphone.

The display device 1000 may display an image IM in a third direction DR3, on a display surface FS parallel to a plane defined by a first direction DR1 and a second direction DR2 crossing each other. The display surface FS on which the image IM is displayed may correspond to a front surface of the display device 1000. The image IM may include a moving image as well as a still image. In FIGS. 1A to 1C, an Internet search window and a clock window are illustrated as examples of the image IM.

According to this embodiment, an upper surface (or a front surface) and a lower surface (or a rear surface) of each component are defined with respect to a direction in which the image IM is displayed, in the unfolded state of the display device 1000. The upper surface and the lower surface may be opposed to each other in (or along) the third direction DR3 and a normal direction of each of the upper surface and the lower surface may be in parallel with the third direction DR3.

The display device 1000 may sense an external input applied from outside the display device 1000. The external input may include various types of input such as contact, light, heat or pressure applied from an input tool such as a body part or an electromagnetic pen. When sensing an input made by an electromagnetic pen, the display device 1000 may further include a digitizer which is driven by using electro magnetic resonance (EMR). However, an embodiment of the invention is not limited to any one embodiment.

FIG. 1A illustrates the display device 1000 in the unfolded state. In an embodiment of the invention, a state in which the display device 1000 is unfolded may be defined as a 'first mode'.

The display surface FS may include an active region F-AA and a peripheral region F-NAA. The peripheral region F-NAA is adjacent to the active region F-AA. The peripheral region F-NAA may have a lower light transmittance than the active region F-AA, and have a predetermined color.

According to this embodiment, the peripheral region F-NAA may surround the active region F-AA. Accordingly, the shape of the active region F-AA may be substantially defined by the peripheral region F-NAA. However, this is an example, and the peripheral region F-NAA may be disposed adjacent to only one side of the active region F-AA or may be omitted.

The display surface FS may further include a signal transmission region TA. The signal transmission region TA is exemplarily illustrated to be included in the active region F-AA, but the invention is not limited thereto. The signal transmission region TA may be included in the peripheral region F-NAA or may be surrounded by each of the active region F-AA and the peripheral region F-NAA.

The signal transmission region TA has a higher light transmittance than the active region F-AA and the peripheral region F-NAA. Natural light, and visible or infrared light may move through the signal transmission region TA.

The display device 1000 may further include a functional component that provides a function to the display device 1000. The functional component may include a sensor which captures an external image through visible light that passes through the signal transmission region TA, or determines, through infrared light, whether an external object approaches. The sensor may overlap (or correspond to) the signal transmission region TA. Accordingly, the display device 1000 including a sensor with improved reliability may be provided.

Referring to FIG. 1B, the display device 1000 according to an embodiment may be folded. For example, the display device 1000 may be folded along a first folding axis AX1 extending in the first direction DR1. The first folding axis AX1 may be formed (or defined) on the display surface FS. For example, the display device 1000 may be folded along a second folding axis AX2 extending in the first direction DR1. The second folding axis AX2 may be formed (or defined) on a rear surface of the display device 1000. In an embodiment of the invention, a state in which the display device 1000 is being folded may be defined as a 'second mode'.

The display device 1000 may include a folding region FA at which the display device 1000 is foldable with respect to one or more of a folding axis AX, and a non-folding region provided in plural including a first non-folding region NFA1 and a second non-folding region NFA2 spaced apart from each other in the second direction DR2 with the folding region FA disposed therebetween.

The display device 1000 may be in-folded such that the display device 1000 is folded with respect to the first folding axis AX1 to dispose portions of the display surface FS at the first non-folding region NFA1 and the second non-folding region NFA2 to face each other.

In addition, referring to FIG. 1C, the display device 1000 may be out-folded such that the display device 1000 is folded with respect to the second folding axis AX2 to dispose portions of the rear surface at the first non-folding region NFA1 and the second non-folding region NFA2 facing away from each other. The second folding axis AX2 may be formed on a surface (e.g., the rear surface) which is opposed to the display surface FS.

According to an embodiment, the display device 1000 may be operated in only one folding manner selected from among the in-folding manner and the out-folding manner with respect to one folding axis. Furthermore, the display device 1000 may be operated in the in-folding manner or the out-folding manner with respect to one folding axis.

Referring to FIG. 1D, when the display device 1000 according to an embodiment is in-folded completely, at least a portion of the folding region FA may have a curvature. In the second mode, the folding region FA may have a curvature center RX on an inner side of the folding region FA, and with respect to the curvature center RX, the display device 1000 may be folded to have a curvature radius R. According to an embodiment, the curvature radius R may be greater than a distance DT between the first non-folding region NFA1 and the second non-folding region NFA2 in the display device 1000 which is folded.

Figure 2:
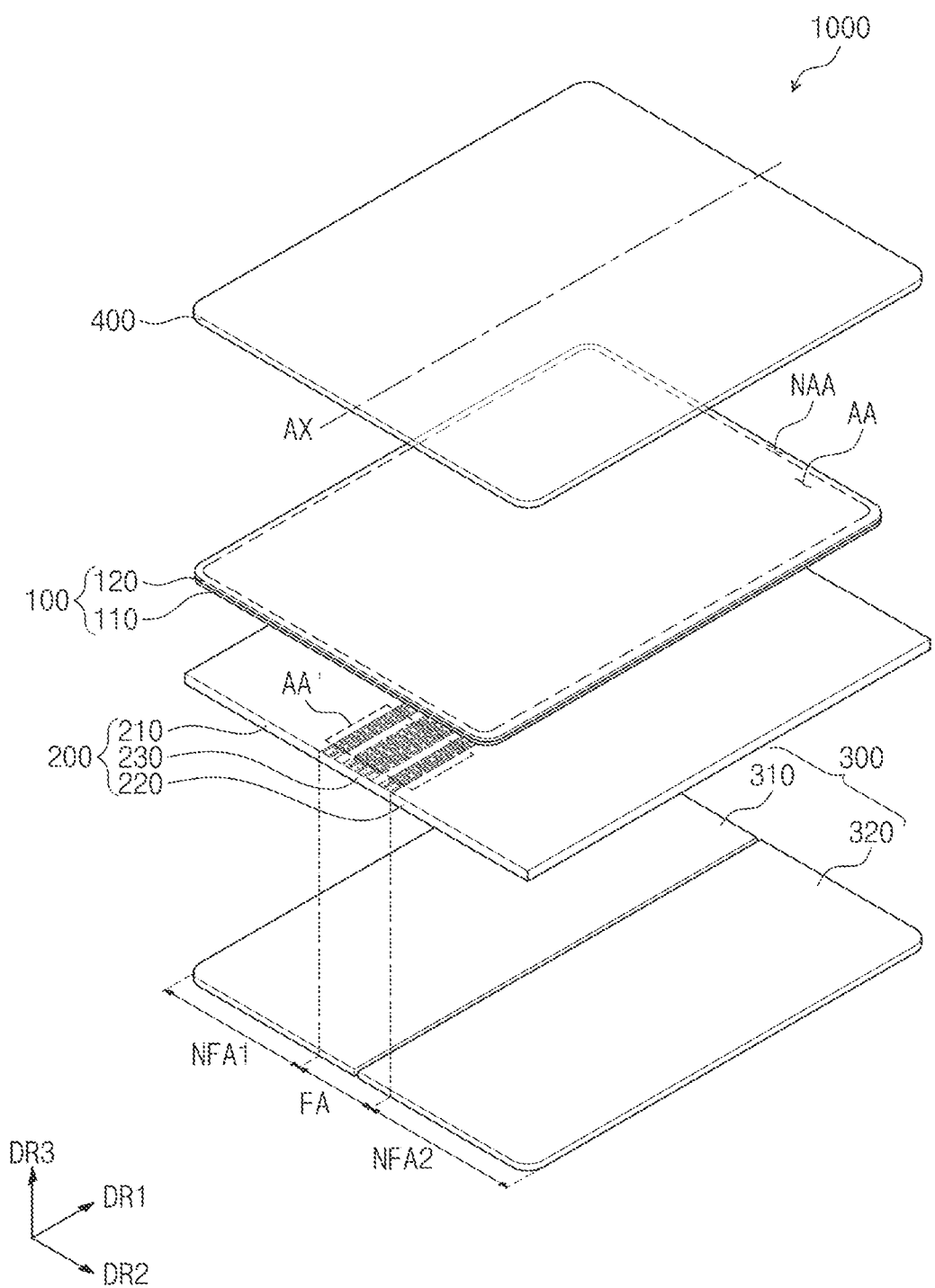
FIG. 2 is an exploded perspective view of a display device according to an embodiment of the invention.
Figure 4A:
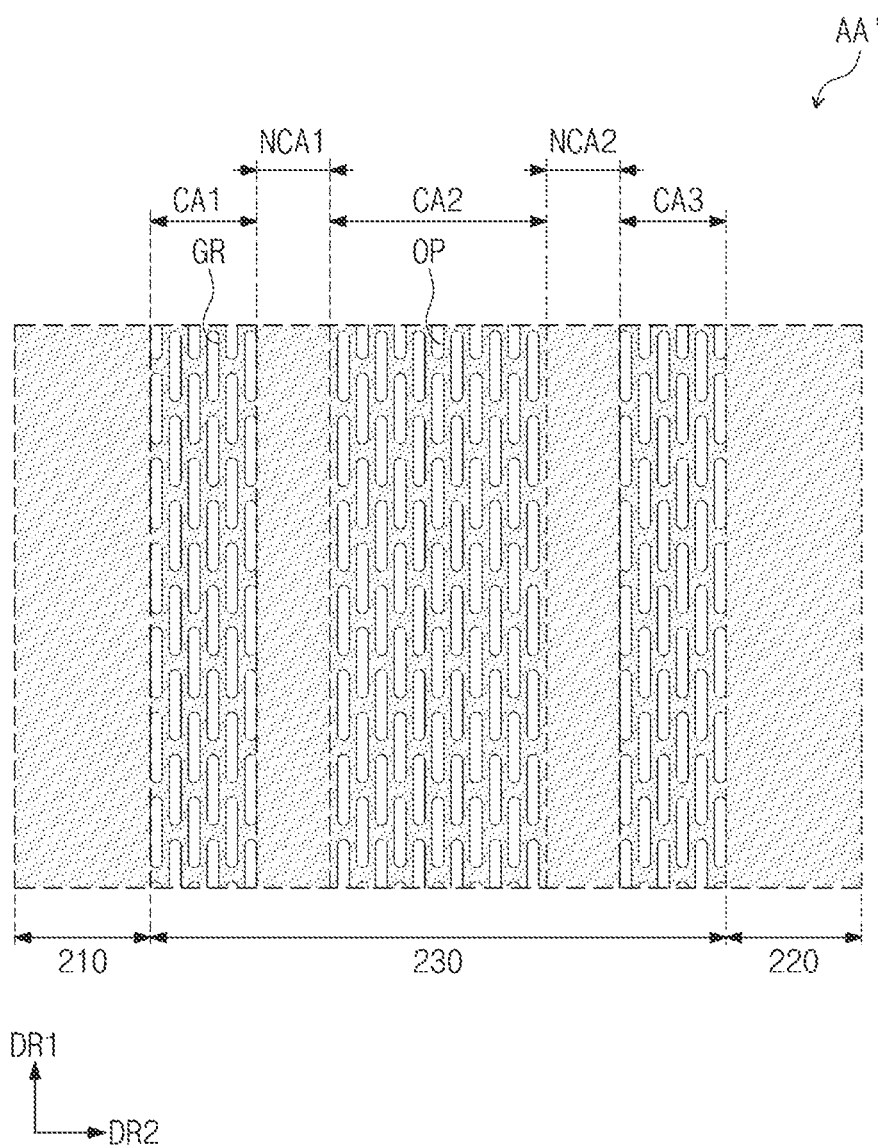
FIG. 4A is a plane view of an unfolded plate according to an embodiment of the invention.
Figure 4B:
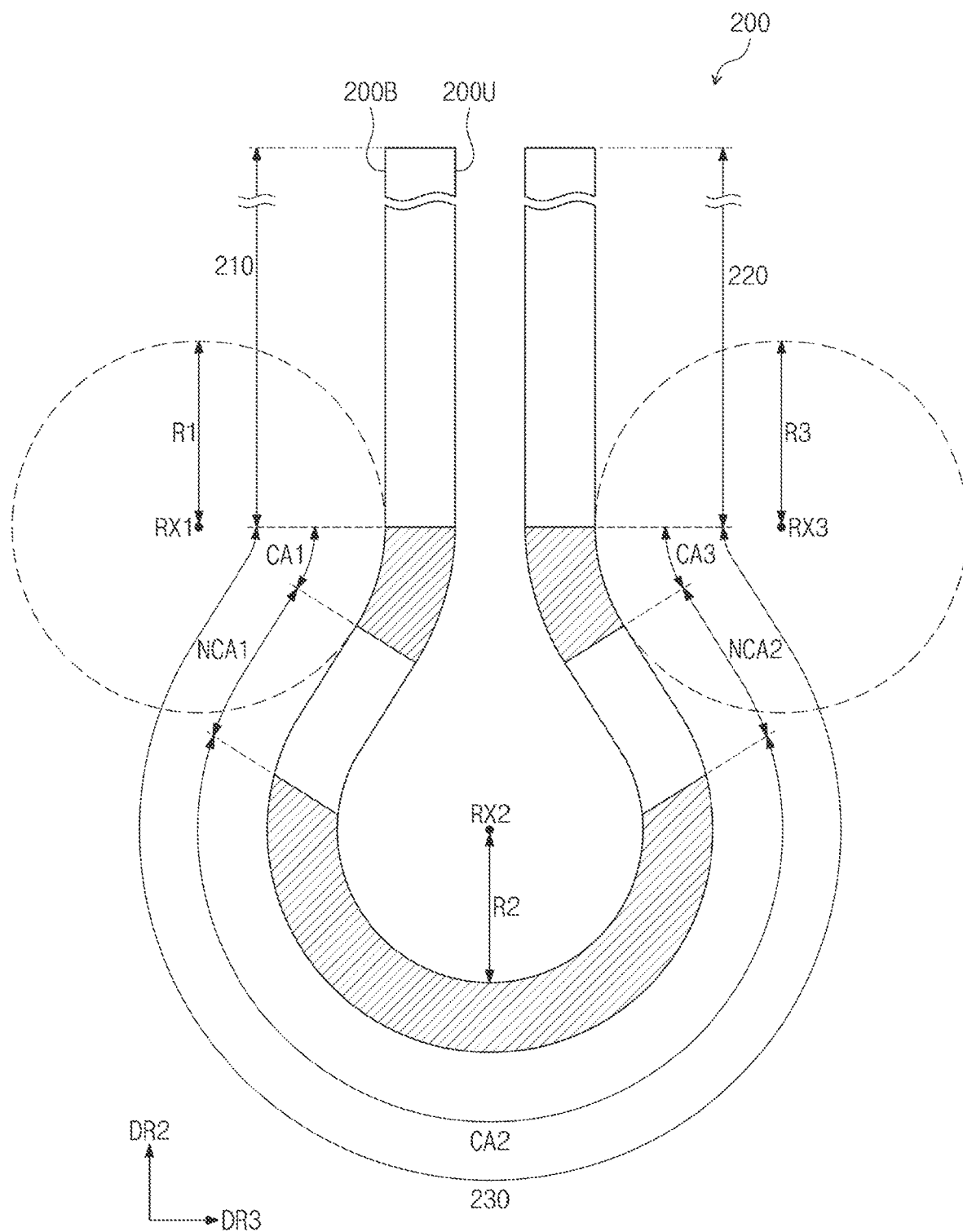
FIG. 4B is a cross-sectional view of a folded plate according to an embodiment of the invention.

FIG. 2 is an exploded perspective view of the display device 1000 according to an embodiment of the invention. FIG. 3 is a cross-sectional view of the display device 1000 according to an embodiment of the invention. FIG. 4A is a plane view of an unfolded plate according to an embodiment of the invention. FIG. 4B is a cross-sectional view of a folded plate according to an embodiment of the invention.

Referring to FIGS. 2 and 3, the display device 1000 may include a display module 100, a plate 200, a cushion layer 300, and a window 400. More specifically, the display device 1000 may include a plurality of adhesive layers AD1-AD6, upper functional layers disposed between the display module 100 and the window 400, and lower functional layers disposed below the plate 200. Various layers and components of the display device 1000 may be foldable and unfoldable together with each other in folding and unfolding of the display device 1000.

The adhesive layers AD1-AD6 to be described below may include any one among an optical clear adhesive (OCA), an optical clear resin (OCR), and a pressure sensitive adhesive (PSA).

The display module 100 may be flexible. The display module 100 may include an active region AA and a peripheral region NAA respectively corresponding to the active region F-AA and the peripheral region F-NAA of the display device 1000 illustrated in FIG. 1A. Hereinafter, the active region F-AA and the peripheral region N-FAA of the display device 1000 are described in the same manner as the active region AA and the peripheral region NAA of the display module 100.

The display module 100 may include a display panel 110 that displays an image and an input sensor 120 that senses an external input. The display panel 110 may be a light-emitting display panel 110, and is not partially limited thereto. For example, the display panel 110 may be an organic light-emitting display panel 110 or an inorganic light-emitting display panel 110. A light-emitting layer of the organic light-emitting display panel 110 may include an organic light-emitting material. A light-emitting layer of the inorganic light-emitting display panel 110 may include a quantum dot or a quantum rod.

The display panel 110 may include a plurality of light-emitting portions. The light-emitting portions are disposed in the active region F-AA and emit light of various colors, respectively. When the light-emitting layers are provided in plurality, the light-emitting portions may correspond to the light-emitting layers, respectively. Moreover, when the light-emitting layer is provided as a single layer, the light-emitting portions correspond to color filters or color conversion members, respectively.

An input sensor 120 may be disposed on the display panel 110. The input sensor 120 may be capacitively driven. The input sensor 120 may sense a location at which an external input such as a user's hand is applied and/or the application intensity of the external input throughout the entire surface of the active region F-AA. The input sensor 120 may be formed (or provided) on the display panel 110 through a consecutive process. In this case, the input sensor 120 may be represented as being 'directly disposed' on the display panel 110. Being directly disposed may mean that a third component is not disposed between the input sensor 120 and the display panel 110. That is, a separate adhesive member may not be disposed between the input sensor 120 and the display panel 110. Element which are 'directly' disposed relative to each other, may form an interface therebetween, without being limited thereto.

However, the invention is not limited thereto. The input sensor 120 may be provided as a separate module and coupled to the display panel 110 via an adhesive layer.

The plate 200 is disposed below the display module 100, and supports the display module 100. The modulus of the plate 200 may be relatively greater than the modulus of the display module 100. Accordingly, during a folding operation in which the display device 1000 repeats operations in the first mode and the second mode, the shape of the display module 100 may be deformed to substantially correspond to the shape of the plate 200.

The plate 200 according to an embodiment may include a first support part 210 (e.g., first support plate), a second support part 220 (e.g., a second support plate), and a folding part 230. The first support part 210 and the second support part 220 may be spaced apart from each other in the second direction DR2 with the folding part 230 disposed therebetween. According to an embodiment of the invention, the first non-folding region NFA1 of the display device 1000 may be defined by the first support part 210, and the second non-folding region NFA2 of the display device 1000 may be defined by the second support part 220.

The plate 200 may include a strong metal material to protect the display module 100. For example, the plate 200 may include stainless steel.

The plate 200 according to an embodiment may include a reinforced fiber composite material. The plate 200 may include a reinforced fiber disposed on an inner side of a matrix portion. The reinforced fiber may be a carbon fiber or a glass fiber. The matrix portion may include a polymer resin. The matrix portion may include a thermoplastic resin.

For example, the matrix portion may include a polyamide-based resin or a polypropylene-based resin. For example, the reinforced fiber composite material may be a carbon fiber reinforced plastic (CFRP) or glass fiber reinforced plastic (GRP).

According to this embodiment, the folding part 230 may include (or define) a plurality of openings and grooves, to reduce stress applied to the folding part 230 when the display device 1000 performs an operation repeatedly in the first and second modes. In an embodiment of the invention, the 'opening' may be provided to pass through one component in a thickness direction, and the 'groove' may be provided by removing a portion of one component in a thickness direction to maintain a thickness portion of the one component. The openings and grooves included in the folding part 230 will be described later.

The cushion layer 300 may be disposed below the plate 200, and may protect the display module 100 against shock transmitted from below the display module 100. The cushion layer 300 may include foam or sponge. The foam may include polyurethane foam or thermoplastic polyurethane foam. When the cushion layer 300 includes foam, a barrier film may be added as a base layer to the cushion layer 300, and the cushion layer 300 may be formed by expanding a foaming agent on the barrier film.

The cushion layer 300 may include a first cushion layer 310 overlapping the first support part 210 and a second cushion layer 320 overlapping the second support part 220. The first cushion layer 310 and the second cushion layer 320 may overlap a portion of the folding part 230. Accordingly, the first cushion layer 310 and the second cushion layer 320 may be spaced apart from each other in the second direction DR2, in a region in which the first cushion layer 310 and the second cushion layer 320 overlap the folding part 230. That is, the cushion layer 300 may be disconnected from each other at the folding region FA.

When the display device 1000 is in the first mode, the first cushion layer 310 and the second cushion layer 320 may prevent foreign substances from entering the openings and grooves defined in the folding part 230. When the display device 1000 is in the second mode, the first cushion layer 310 and the second cushion layer 320 are spaced apart from the folding part 230 even in the case where the folding part 230 is folded with a curvature, thereby making it possible to easily deform the shape of the plate 200.

The window 400 is disposed on the display module 100. The window 400 may include an optically transparent material so that light provided (or generated) by the display module 100 may pass therethrough to outside the display device 1000. The window 400 provides the display surface FS (see FIG. 1A) of the display device 1000.

The window 400 may include a first layer 410, a second layer 420 facing the first layer 410, and a bezel pattern BZ. The first layer 410 may include glass.

The second layer 420 is disposed on the first layer 410. The second layer 420 may include a material having a relatively lower modulus than the first layer 410. For example, the second layer 420 may be a film including an organic material. The second layer 420 may have a relatively greater thickness than the first layer 410. Accordingly, the second layer 420 may protect an upper surface of the first layer 410.

The second layer 420 may include at least one functional layer. The functional layer may include at least one of a window protective layer, an anti-fingerprint layer, or an anti-reflection layer.

The window 400 may allow an image IM from the display module 100 to be transmitted therethrough, and reduces external shock, thereby preventing the display module 100 from being damaged and malfunctioning by external shock.

According to an embodiment, the window 400 may include a thin-film glass or a synthetic resin film. When the window 400 includes a thin-film glass, the window 400 may be have a thickness of about 100 micrometers (μm) or less. For example, the window 400 may have a thickness of about 30 μm. However, the invention is not limited thereto.

When the window 400 includes a synthetic resin film, the window 400 may include a polyimide (PI) film or a polyethylene terephthalate (PET) film.

The window 400 may have a multi-layered structure or a single-layered structure. For example, the window 400 may include a plurality of synthetic resin films bonded to each other by an adhesive, or include a glass substrate and a synthetic resin film bonded to each other by an adhesive.

The window 400 may be made of (or include) a soft material. Accordingly, the window 400 may be folded or unfolded with respect to one or more of a folding axis AX. That is, according to operations in the first mode and the second mode, the shape of the window 400 may be deformed to correspond to the shape of the plate 200.

An optical layer OPL and a first adhesive layer AD1 may be disposed. The optical layer OPL may be disposed on the display module 100. The optical layer OPL may reduce the reflectance of external light. The optical layer OPL may include a stretchable synthetic resin film. For example, the optical layer OPL may be provided by dyeing a polyvinyl alcohol (PVA) film with an iodine compound. In addition, the optical layer OPL may include a color filter. The optical layer OPL may include various layers as long as being capable of reducing the reflectance of external light. However, the invention is not limited to any one embodiment.

The optical layer OPL and the window 400 may be bonded to each other by a first adhesive layer AD1. The optical layer OPL may be disposed on the display module 100. The optical layer OPL may reduce the reflectance of external light. The optical layer OPL may include a stretchable synthetic resin film. For example, the optical layer OPL may be provided by dyeing a polyvinyl alcohol (PVA) film with an iodine compound. In addition, the optical layer OPL may include a color filter. The optical layer OPL may include various layers as long as being capable of reducing the reflectance of external light. However, the invention is not limited to any one embodiment.

The display module 100 and the optical layer OPL may be bonded to each other by a second adhesive layer AD2.

A panel protective film PFL and a lower protective film CPL may be disposed below the display module 100. The panel protective film PFL and the display module 100 may be bonded to each other by a third adhesive layer AD3. The panel protective film PFL may be disposed below the display module 100. The panel protective film PFL may protect a lower portion of the display module 100. The panel protective film PFL may include a flexible plastic material. For example, the panel protective film PFL may include polyethylene terephthalate.

The lower protective film CPL may be disposed below the panel protective film PFL. The lower protective film CPL and the panel protective film PFL may be bonded to each other by a fourth adhesive layer AD4. The lower protective film CPL may have a predetermined color. The lower protective film CPL may prevent a rear surface of the display module 100 from being visible by light while protecting the rear surface of the display module 100. The lower protective film CPL may be formed of a material with a high light absorbance.

The plate 200 and the lower protective film CPL may be bonded to each other by a fifth adhesive layer AD5. In the fifth adhesive layer AD5, a first adhesive opening OP5 overlapping the folding part 230 may be defined to improve the folding characteristics of the plate 200. According to an embodiment, the lower protective film CPL may further include a recessed portion overlapping the first adhesive opening OP5 and formed by partially removing a thickness portion of the lower protective film CPL.

The cushion layer 300 and the plate 200 may be bonded to each other by a sixth adhesive layer AD6. In the sixth adhesive layer AD6, a second adhesive opening OP6 overlapping the folding part 230 may be defined to improve the folding characteristics of the plate 200. The adhesive openings OP5 and OP6 may expose the openings and grooves defined in the folding part 230 to outside the plate 200, and thus the shape of the folding part 230 may be easily deformed. Accordingly, a display device 1000 with improved folding characteristics may be provided.

The display device 1000 may further include a metal plate CS, an insulating layer TP, and a step compensation member AS which are disposed below the cushion layer 300. The metal plate CS and the step compensation member AS may be coplanar with each other, without being limited thereto. The metal plate CS may protect the display module 100 by absorbing external shock. The metal plate CS may include stainless steel. The metal plate CS may include a first metal layer CS1 and a second metal layer CS2. The first metal layer CS1 may be bonded to the first cushion layer 310 by an adhesive layer (not shown), and the second metal layer CS2 may be bonded to the second cushion layer 320 by an adhesive layer.

The insulating layer TP is disposed below the metal plate CS. The insulating layer TP may prevent static electricity from flowing into the metal plate CS. The insulating layer TP may be an insulating film. The insulating layer TP may be provided as a first insulating layer TP1 and a second insulating layer TP2, which may be bonded to the first metal layer CS1 and the second metal layer CS2, respectively.

The step compensation member AS may be bonded to a lower side of the cushion layer 300. The step compensation member AS may be a double-sided tape or an insulating film. The step compensation member AS may be provided as a first step compensation member AS1 and a second step compensation member AS2, which may be bonded to the first cushion layer 310 and the second cushion layer 320, respectively.

Referring to FIG. 4A and FIG. 4B, the plate 200 according to an embodiment of the invention will be described.

The plate 200 according to an embodiment of the invention includes a first support part 210, a second support part 220, and a folding part 230. The first support part 210 and the second support part 220 may be spaced apart from each other in the second direction DR2 with the folding part 230 disposed therebetween. When the operation mode of the display device 1000 (see FIG. 3) is switched from the first mode to the second mode, the shape of the folding part 230 may be deformed. For example, in the second mode, the display device 1000 at the folding part 230 may be deformed into a dumb-bell shape with different curvatures.

The folding part 230 may include a (2-1)-st curved portion CA1 (e.g., a second curved portion or a second curvable portion) closest to the first support part 210, a first flat portion NCA1 extended from the (2-1)-st curved portion CA1 in a direction away from the folding part 230, a first curved portion CA2 (e.g., a first curvable portion), a second flat portion NCA2, and a (2-2)-nd curved portion CA3 (e.g., a second curved portion or a second curvable portion) closest to the second support part 220, in order. The (2-1)-st curved portion CA1 may be curved in a different direction than the first curved portion CA2, where a change in the direction of curvature may be defined between the 2-1)-st curved portion CA1 and the first curved portion CA2, such as at the first flat portion NCA1. The (2-2)-nd curved portion CA3 and the first curved portion CA2 may be considered similarly.

The (2-1)-st curved portion CA2 and the (2-2)-nd curved portion CA3 may each include (or define) a groove GR provided in plural including a plurality of grooves GR, formed by a body of the plate 200 being partially recessed. The grooves GR may be defined by recessing a portion of the plate 200 from either of a first surface 200U adjacent to the display module 100 or a second surface 200B opposite to the first surface 200U of the plate 200.

The first curved portion CA2 may include an opening OP provided in plural in including a plurality of openings OP passing through the body of the plate 200, such as completely through a thickness of the plate 200. The openings OP may be defined through (and open at) the first surface 200U and the second surface 200B. The grooves GR and the openings OP may be arranged in a grid or lattice form, in the folding part 230.

Referring to FIG. 4A, for example, a planar area (or total area) of a region may be defined as a product of dimensions along the first direction DR1 and the second direction DR2. According to an embodiment of the invention, with respect to the total (planar) area of the folding part 230, a ratio of the planar area of the (2-1)-st curved portion CA1 and the planar area of the (2-2)-nd curved portion CA3 in which the grooves GR are defined, may be from about 10% to about 35%. In an embodiment, a ratio of the planar area of each of the (2-1)-st curved portion CA1 may be from about 10% to about 35% of a total planar area of the folding part 230. Similarly, a ratio of the planar area of the (2-2)-nd curved portion CA3, may be from about 10% to about 35% of a total planar area of the folding part 230.

When the respective ratio of the areas of the curved portions CA1 and CA3 is less than about 10% of a total planar area of the folding part 230, stress applied to the (2-1)-st curved portion CA1 and the (2-2)-nd curved portion CA3 in the second mode may not be reduced, and cracks may thus occur in the curved portions CA1 and CA3.

When the respective ratio of the areas of the curved portions CA1 and CA3 is greater than about 35% of a total planar area of the folding part 230, a width in the second direction DR2 between the first flat portion NCA1 and the second flat portion NCA2 is reduced, and the number of openings OP of the first curved portion CA2, and the number of the grooves GR of the curved portion CA1 and CA3 unnecessarily increase in the folding part 230. Accordingly, in the second mode, a support force of the folding part 230 against the display module 100 is reduced.

As illustrated in FIG. 4B, in the second mode, the first curved portion CA2 of the folding part 230 is folded with a second curvature radius R2 along the second axis RX2 to have a first curvature. The (2-1)-st curved portion CA1 of the folding part 230 may be folded with the first curvature radius R1 along the first axis RX1 to have a second curvature, and the (2-2)-nd curved portion CA3 may be folded with a third curvature radius R3 along the third axis RX3 to have a second curvature. According to an embodiment of the invention, the first curvature may be smaller than the second curvature. The folding part 230 which is folded may define the various curvature radii and the various axes as part of virtual circular shapes.

According to an embodiment of the invention, the first curved portion CA2, the (2-1)-st curved portion CA1, and the (2-2)-nd curved portion CA3 may be folded in different directions, and thus, when the display device 1000 is in the second mode, the first support part 210 and the second support part 220 may be disposed much closer to each other along a thickness direction of the display device 1000 which is folded. Accordingly, as illustrated in FIG. 1D, in the second mode, the display device 1000 may be in-folded such that the non-folding region NFA1 and the second non-folding region NFA2 of the display device 1000 may further naturally face each other and minimize the distance DT.

As the folding part 230 in the foldable display device 1000 becomes shorter along the second direction DR2, a greater space for storing, within a case (not shown) of the display device 1000, components disposed below the plate 200 may be ensured. As the first flat portion NCA1 and the second flat portion NCA2 of the folding part 230 become shorter along the second direction DR2, the display device 1000 may have more improved aesthetic sense when folded.

Accordingly, as the folding part 230 becomes shorter, stress applied to the (2-1)-st curved portion CA1 and the (2-2)-nd curved portion CA3 may be increased. A structure of the plate 200 may provide reduced stress at the (2-1)-st curved portion CA1 and the (2-2)-nd curved portion CA3. Hereinafter, referring to FIGS. 5A to 10B, embodiments pertaining to a plate 200 capable of reducing stress applied to portions thereof at the folding part 230 will be described.

Figure 5A:
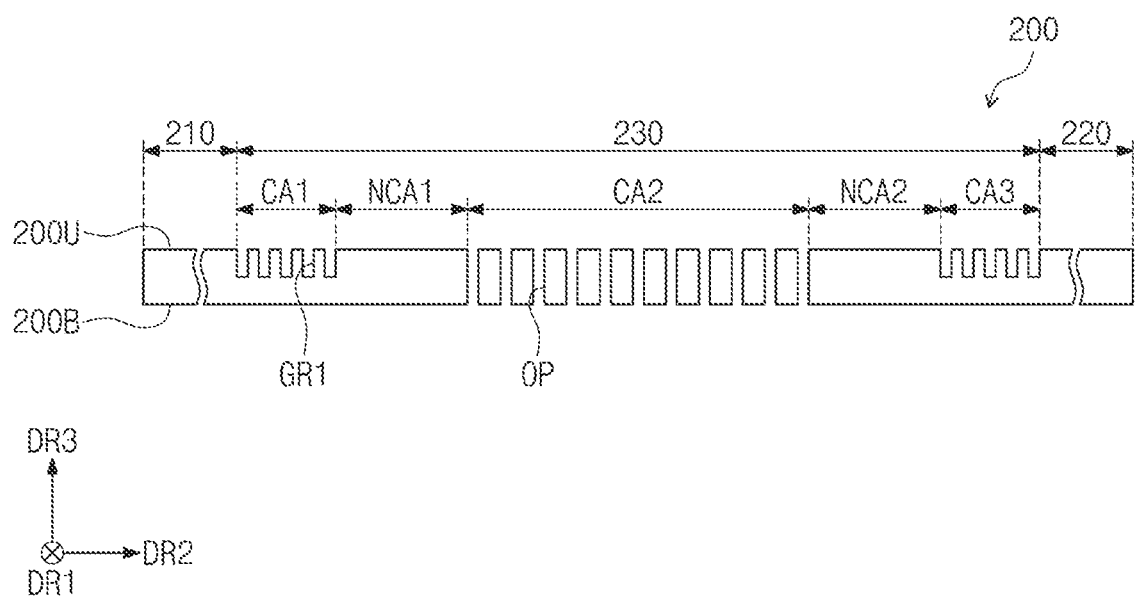
FIG. 5A is a cross-sectional view of an unfolded plate according to an embodiment of the invention.
Figure 5B:
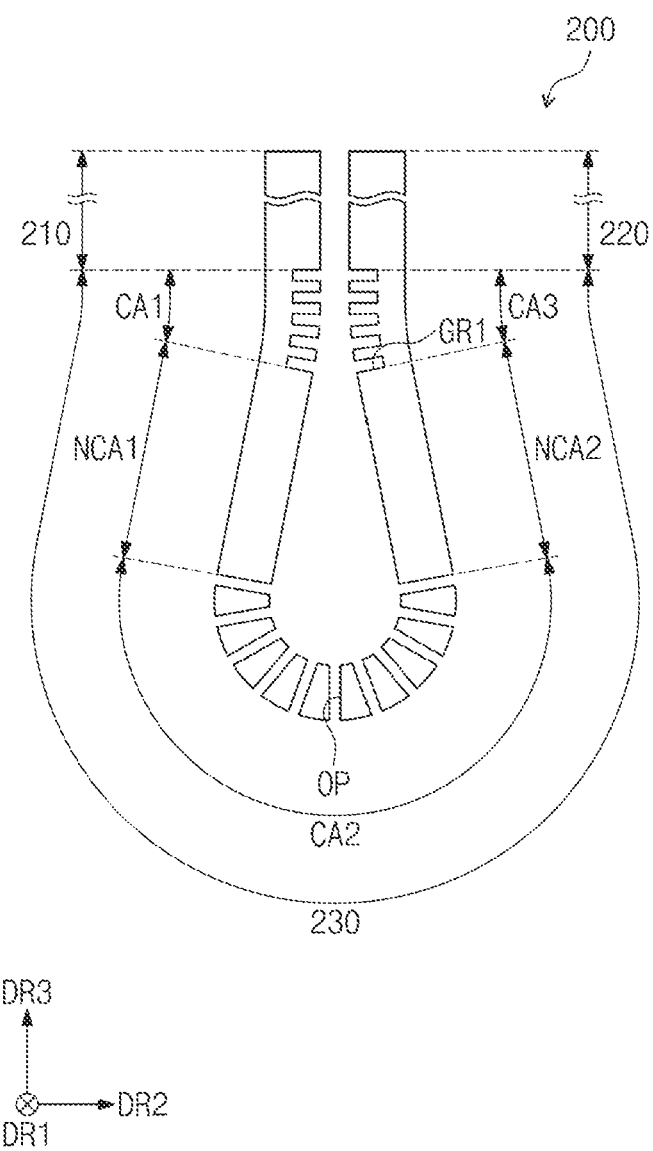
FIG. 5B is a cross-sectional view of a folded plate according to an embodiment of the invention.

FIG. 5A is a cross-sectional view of an unfolded plate according to an embodiment of the invention. FIG. 5B is a cross-sectional view of a folded plate according to an embodiment of the invention.

Referring to FIGS. 5A and 5B, the plate 200 according to an embodiment may include a first surface 200U adjacent to the display module 100 (see FIG. 3) and a second surface 200B facing (and opposite to) the first surface 200U.

The plate 200 includes a first support part 210, a second support part 220, and a folding part 230. The folding part 230 may include a (2-1)-st curved portion CA1 adjacent to the first support part 210, a first flat portion NCA1, a first curved portion CA2, a second flat portion NCA2, and a (2-2)-nd curved portion CA3 adjacent to the second support part 220, in order.

The first curved portion CA2 may define therein openings OP which pass through first surface 200U and the second surface 200B. The openings OP may be arranged spaced apart from each other in the second direction DR2.

According to an embodiment, the (2-1)-st curved portion CA1 and the (2-2)-nd curved portion CA3 may each include a first groove GR1 provided in plural including a plurality of first grooves GR1. The first grooves GR1 may be defined by partially recessing the body of the plate 200, in the third direction DR3, from the respective first surfaces 200U at the (2-1)-st curved portion CA1 and the (2-2)-nd curved portion CA3. That is, the first grooves GR1 are open at the first surface 200U of the plate 200.

As illustrated in FIG. 5B, in the second mode, tensile stress may be applied to the respective first surfaces 200U of the (2-1)-st curved portion CA1 and the (2-2)-nd curved portion CA3. According to this embodiment, as the first grooves GR1 of the (2-1)-st curved portion CA1 and the first grooves GR1 of the (2-2)-nd curved portion CA3 are included in the plate 200, the shapes of the plate 200 at the respective first surfaces 200U of the (2-1)-st curved portion CA1 and the (2-2)-nd curved portion CA3 may be easily deformed. Accordingly, tensile stress applied to the (2-1)-st curved portion CA1 and the (2-2)-nd curved portion CA3 may be relaxed.

Figure 6A:
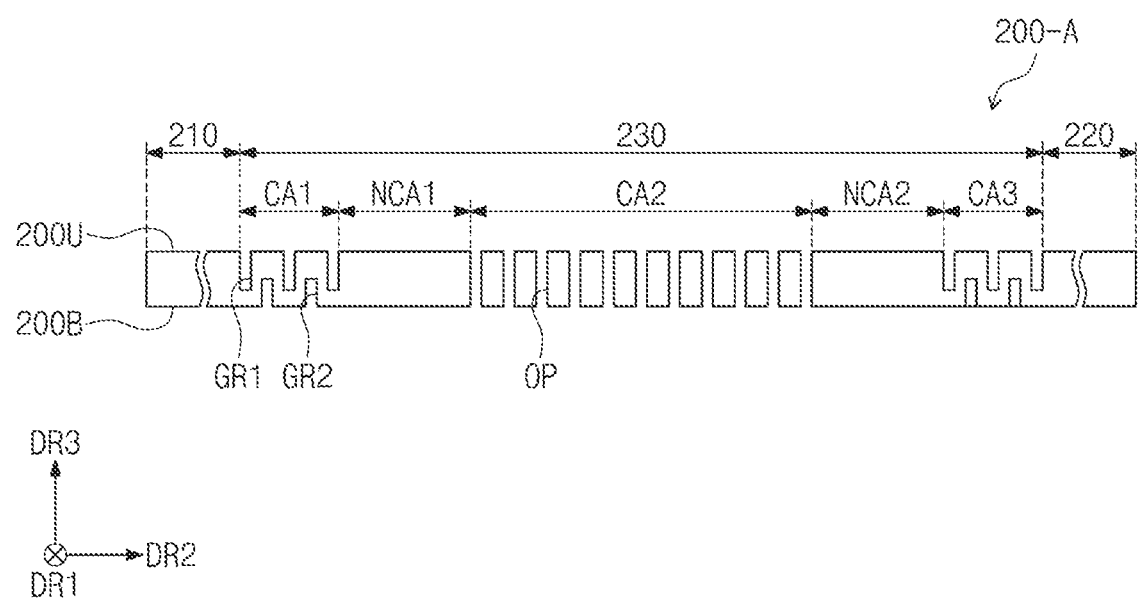
FIG. 6A is a cross-sectional view of an unfolded plate according to an embodiment of the invention.

FIG. 6A is a cross-sectional view of an unfolded plate according to an embodiment of the invention. FIG. 4B is a cross-sectional view of a folded plate according to an embodiment of the invention.

Figure 6B:
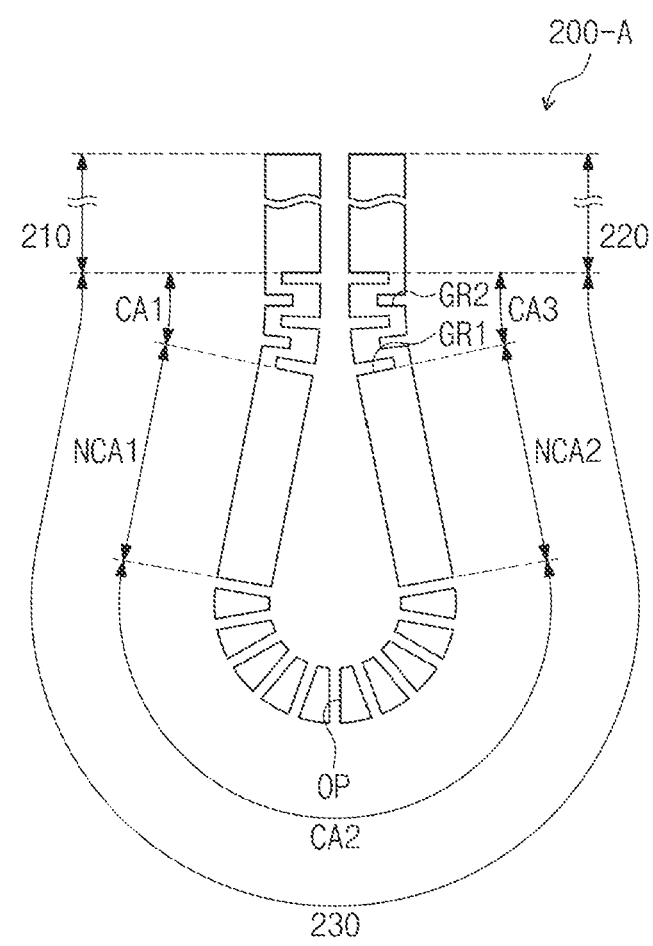
FIG. 6B is a cross-sectional view of a folded plate according to an embodiment of the invention.

Referring to FIG. 6A and FIG. 6B, a plate 200-A according to an embodiment may include the first surface 200U adjacent to the display module 100 (see FIG. 3) and the second surface 200B facing the first surface 200U.

The plate 200-A includes the first support part 210, the second support part 220, and the folding part 230. The folding part 230 may include a (2-1)-st curved portion CA1, a first flat portion NCA1, a first curved portion CA2, a second flat portion NCA2, and a (2-2)-nd curved portion CA3.

The first curved portion CA2 may include therein openings OP defined to pass through the first surface 200U and the second surface 200B. The openings OP may be arranged apart from each other in the second direction DR2.

According to an embodiment, the (2-1)-st curved portion CA1 and the (2-2)-nd curved portion CA3 may each include first grooves GR1 and a second groove GR2 provided in plural including a plurality of second grooves GR2. The first grooves GR1 may be defined by partially recessing the plate 200-A, in the third direction DR3, from the respective first surfaces 200U of the (2-1)-st curved portion CA1 and the (2-2)-nd curved portion CA3.

The second grooves GR2 may be defined by partially recessing the plate 200-A, in the third direction DR3, from the respective second surfaces 200B of the (2-1)-st curved portion CA1 and the (2-2)-nd curved portion CA3. That is, the second grooves GR2 are open at the second surface 200B of the plate 200-A. In a direction along the plate 200-A, the first grooves GR1 and the second grooves GR2 may alternate with each other, without being limited thereto. In an embodiment, each of the first grooves GR1 and the second grooves GR2 may intersect a virtual line parallel to one of the outer surfaces of the plate 200-A, such as to each be recessed to a same thickness level of the body of the plate 200-A.

According to this embodiment, a first depth of each of the first grooves GR1 from the first surface 200U in the third direction DR3, may be different from a second depth of each of the second grooves GR2 from the second surface 200B in the third direction DR3.

In this embodiment, the first depth may be greater than the second depth. For example, the first depth may be about 70% or less of the thickness (as a total thickness or maximum thickness) of the body of the plate 200-A in the third direction DR3, and the second depth may be about 50% or less of the thickness of the plate 200-A in the third direction DR3.

The plate 200-A according to an embodiment may have a thickness of about 80 μm to about 100 μm.

As illustrated in FIG. 6B, in the second mode, tensile stress may be applied to the respective first surfaces 200U of the (2-1)-st curved portion CA1 and the (2-2)-nd curved portion CA3, and compression stress may be applied to the second surface 200B.

According to this embodiment, since the (2-1)-st curved portion CA1 and the (2-2)-nd curved portion CA3 each include the first grooves GR1 and the second grooves GR2 defined in different surfaces, the shapes of the first surface 200U and the second surface 200B of each of the (2-1)-st curved portion CA1 and the (2-2)-nd curved portion CA3 may be easily deformed. Accordingly, tensile stress and compression stress applied to the (2-1)-st curved portion CA1 and the (2-2)-nd curved portion CA3 may be relaxed.

Figure 7A:
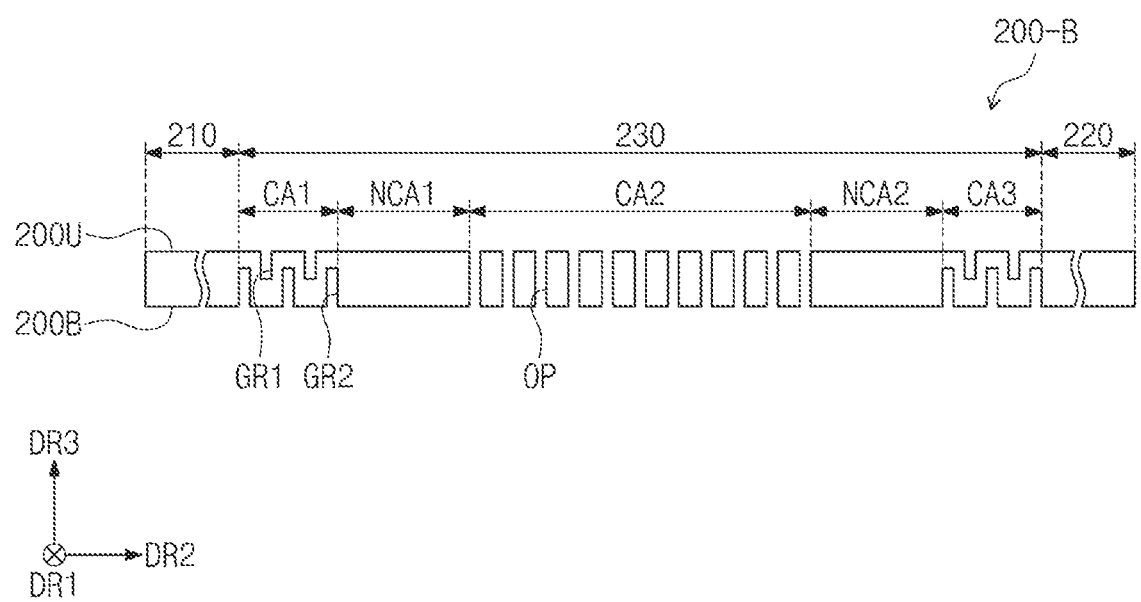
FIG. 7A is a cross-sectional view of an unfolded plate according to an embodiment of the invention.
Figure 7B:
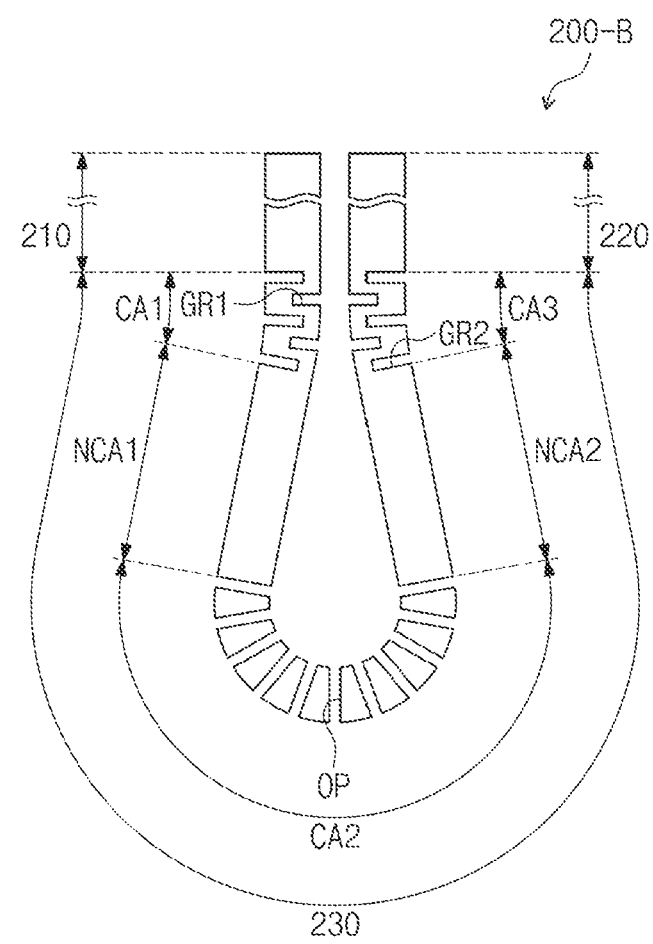
FIG. 7B is a cross-sectional view of a folded plate according to an embodiment of the invention.

FIG. 7A is a cross-sectional view of an unfolded plate according to an embodiment of the invention. FIG. 7B is a cross-sectional view of a folded plate according to an embodiment of the invention. Differences from the plate 200-A described in FIG. 6A and FIG. 6B will be mainly described.

According to an embodiment, the (2-1)-st curved portion CA1 and the (2-2)-nd curved portion CA3 of the plate 200-B may each include first grooves GR1 and second grooves GR2. The first grooves GR1 may be defined by partially recessing the plate 200-B, in the third direction DR3, from the respective first surfaces 200U of the (2-1)-st curved portion CA1 and the (2-2)-nd curved portion CA3.

The second grooves GR2 may be defined by partially recessing the plate 200-B, in the third direction DR3, from the respective second surfaces 200B of the (2-1)-st curved portion CA1 and the (2-2)-nd curved portion CA3.

According to this embodiment, a third depth of each of the first grooves GR1 from the first surface 200U in the third direction DR3 may be different from a fourth depth of each of the second grooves GR2 from the second surface 200B in the third direction DR3.

According to this embodiment, the fourth depth may be greater than the third depth. For example, the third depth may be about 50% or less of the thickness of the plate 200-B in the third direction DR3, and the fourth depth may be about 70% or less of the thickness of the plate 200-B in the third direction DR3.

According to an embodiment, the plate 200-B may have a thickness of about 80 μm to about 200 μm.

Figure 8A:
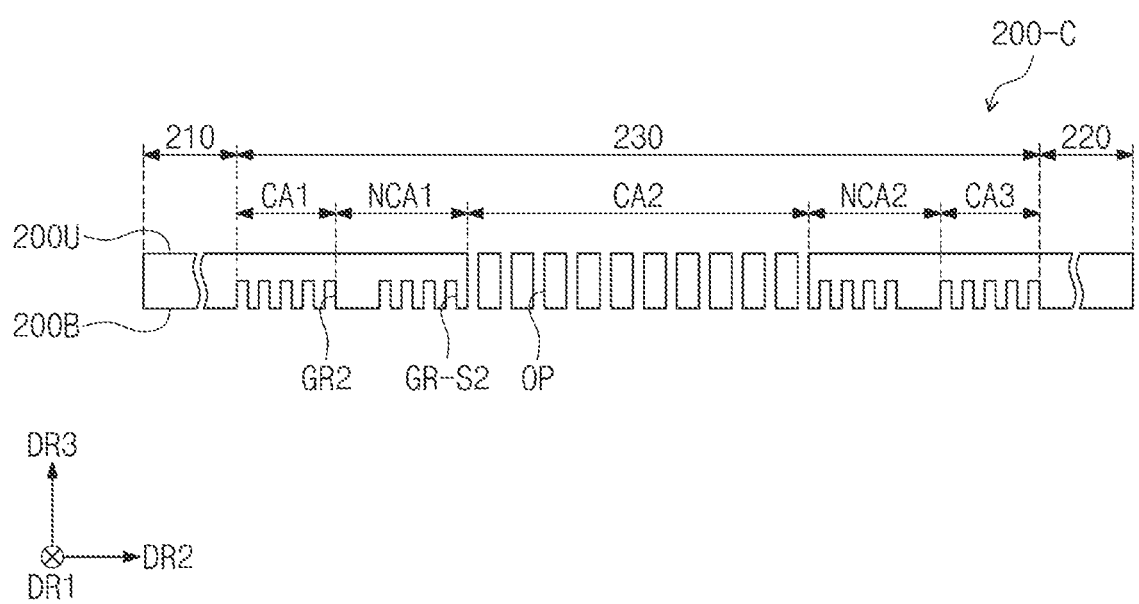
FIG. 8A is a cross-sectional view of an unfolded plate according to an embodiment of the invention.
Figure 8B:
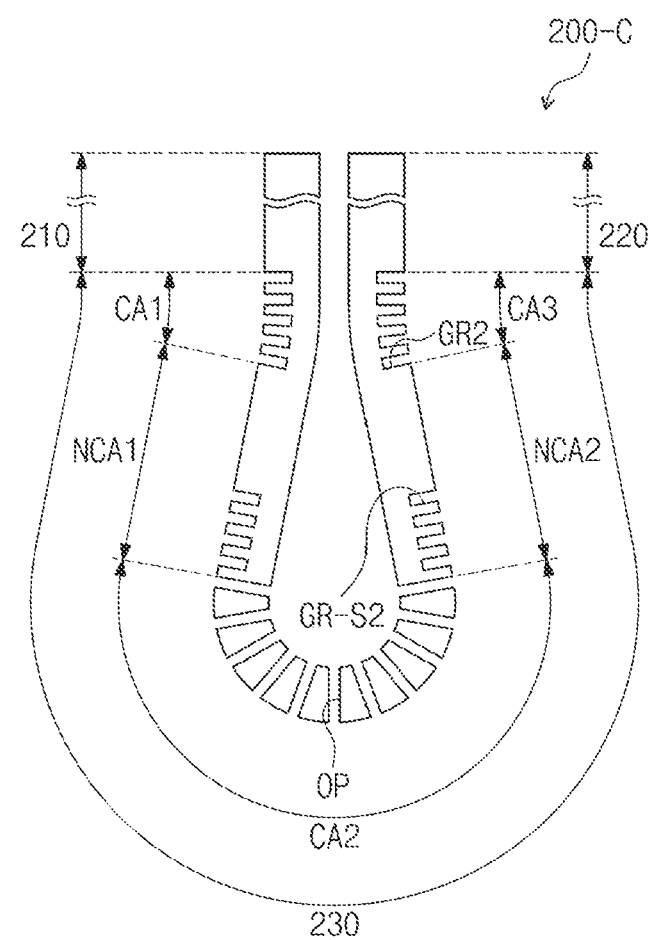
FIG. 8B is a cross-sectional view of a folded plate according to an embodiment of the invention.
Figure 8C:
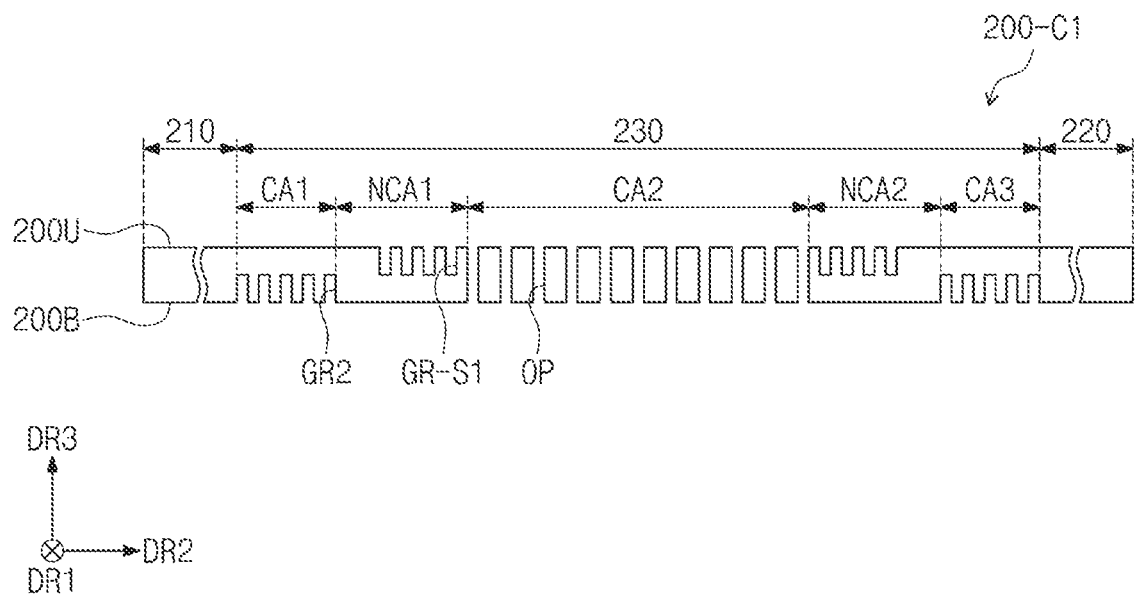
FIG. 8C is a cross-sectional view of an unfolded plate according to an embodiment of the invention.
Figure 8D:
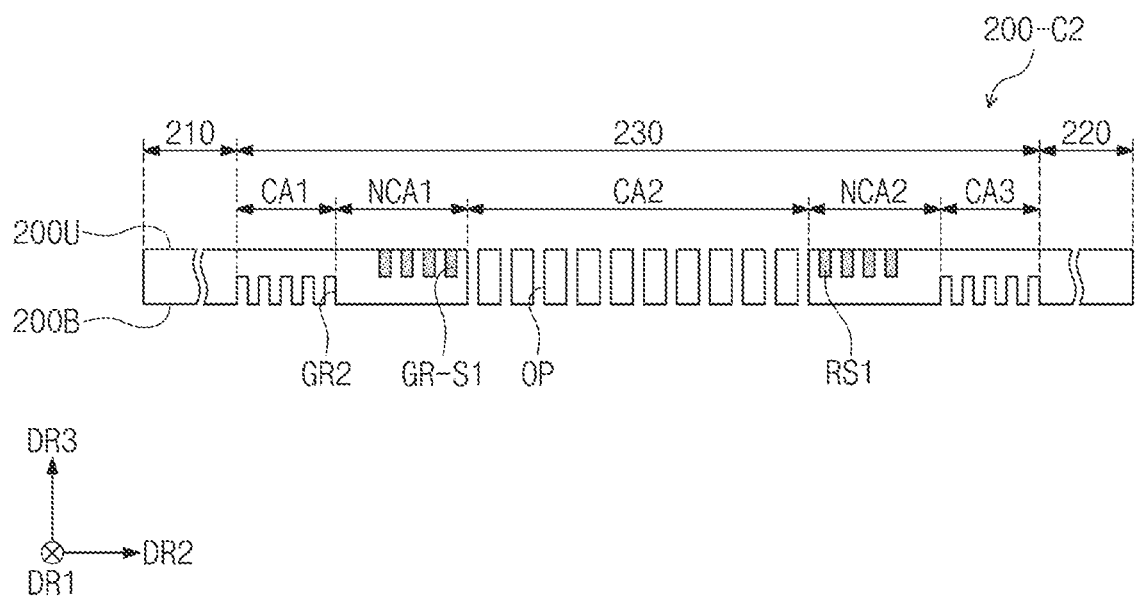
FIG. 8D is a cross-sectional view of an unfolded plate according to an embodiment of the invention.

FIG. 8A is a cross-sectional view of an unfolded plate according to an embodiment of the invention. FIG. 8B is a cross-sectional view of a folded plate according to an embodiment of the invention. FIG. 8C is a cross-sectional view of an unfolded plate according to an embodiment of the invention. FIG. 8D is a cross-sectional view of an unfolded plate an embodiment of the invention.

Referring to FIG. 8A and FIG. 8B, the plate 200-C according to an embodiment may include a first surface 200U adjacent to the display module 100 (see FIG. 3) and a second surface 200B facing the first surface 200U.

The plate 200-C includes a first support part 210, a second support part 220, and a folding part 230. The folding part 230 may include a (2-1)-st curved portion CA1, a first flat portion NCA1, a first curved portion CA2, a second flat portion NCA2, and a (2-2)-nd curved portion CA3.

The first curved portion CA2 may include openings OP therein defined to pass through the first surface 200U and the second surface 200B. The openings OP may be arranged apart from each other in the second direction DR2.

According to an embodiment, the (2-1)-st curved portion CA1 and the (2-2)-nd curved portion CA3 may each include second grooves GR2. The second grooves GR2 may be defined by partially recessing the plate 200-C, in the third direction DR3, from the respective second surfaces 200B of the (2-1)-st curved portion CA1 and the (2-2)-nd curved portion CA3.

According to this embodiment, the first flat portion NCA1 and the second flat portion NCA2 may each include lower additional grooves GR-S2 (e.g., a third groove provided in plural including a plurality of third grooves). The lower additional grooves GR-S2 may be defined by partially recessing the plate 200-C, in the third direction DR3, from the respective second surfaces 200B of the first flat portion NCA1 and the second flat portion NCA2.

As illustrated in FIG. 8B, in the second mode, compression stress may be applied to the second surfaces 200B of the (2-1)-st curved portion CA1 and the (2-2)-nd curved portion CA3. As the first grooves GR1 of the (2-1)-st curved portion CA1 and the second grooves GR2 of the (2-2)-nd curved portion CA3 are included, the shapes of the respective second surfaces 200B of the (2-1)-st curved portion CA1 and the (2-2)-nd curved portion CA3 may be easily deformed.

A plurality of lower grooves recessed from the second surface 200B, may define a group of lower grooves. Referring to FIGS. 8A and 8B, the plate 200-C may include a plurality of groups of the lower grooves, and the groups may be spaced apart from each other in a direction along the plate 200-C (or along the second surface 200B). For example, among the plurality of groups of the lower grooves, a first group of lower grooves may be closest to the first curved portion CA2, while a second group of lower grooves may be further from the first curved portion CA2 than the first group of lower grooves.

In addition, according to this embodiment, since the second surface 200B of each of the first flat portion NCA1 and the second flat portion NCA2 includes the lower additional grooves GR-S2, the shape of one end of the first curved portion CA2 adjacent to the first flat portion NCA1, and the shape of the other end of the first curved portion CA2 adjacent to the second flat portion NCA2, may be easily deformed.

Referring to FIG. 8C, the first flat portion NCA1 and the second flat portion NCA2 of the plate 200-C1 may each include additional upper grooves GR-S1. The additional upper grooves GR-S1 may be defined by partially recessing the plate 200-C1, in the third direction DR3, the respective first surfaces 200U of the first flat portion NCA1 and the second flat portion NCA2.

A plurality of upper grooves recessed from the first surface 200U, may define a group of upper grooves. Referring to FIG. 8C, the plate 200-C1 may include a plurality of groups of grooves, and the groups may be spaced apart from each other in a direction along the plate 200-C1. For example, among the plurality of groups of grooves, a group of upper grooves may be closest to the first curved portion CA2, while a group of lower grooves may be further from the first curved portion CA2 than the group of upper grooves.

Referring to FIG. 8D, the first flat portion NCA1 and the second flat portion NCA2 of the plate 200-C2 may each include additional upper grooves GR-S1. The additional upper grooves GR-S1 may be defined by partially recessing the plate 200-C2, in the third direction DR3, from the respective first surfaces 200U of the first flat portion NCA1 and the second flat portion NCA2.

According to an embodiment, the first flat portion NCA1 and the second flat portion NCA2 may each further include a resin pattern RS1 provided in plural including a plurality of upper resin patterns RS1 respectively disposed in the additional upper grooves GR-S1. As the upper resin patterns RS1 are disposed in the additional upper grooves GR-S1, a phenomenon in which the additional upper grooves GR-S1 are visible from outside the display device 1000 in the first mode may be avoided. An upper surface of each of the upper resin patterns RS1 may be coplanar with portions of the first surface 200U adjacent to the additional upper grooves GR-S1, without being limited thereto.

Figure 9A:
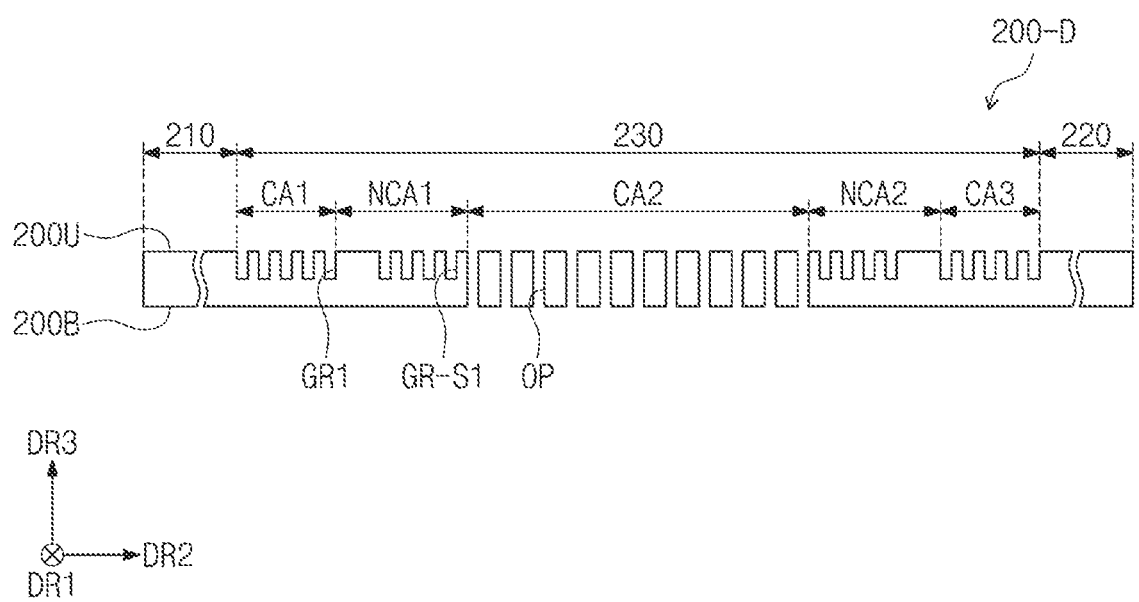
FIG. 9A is a cross-sectional view of an unfolded plate according to an embodiment of the invention.
Figure 9B:
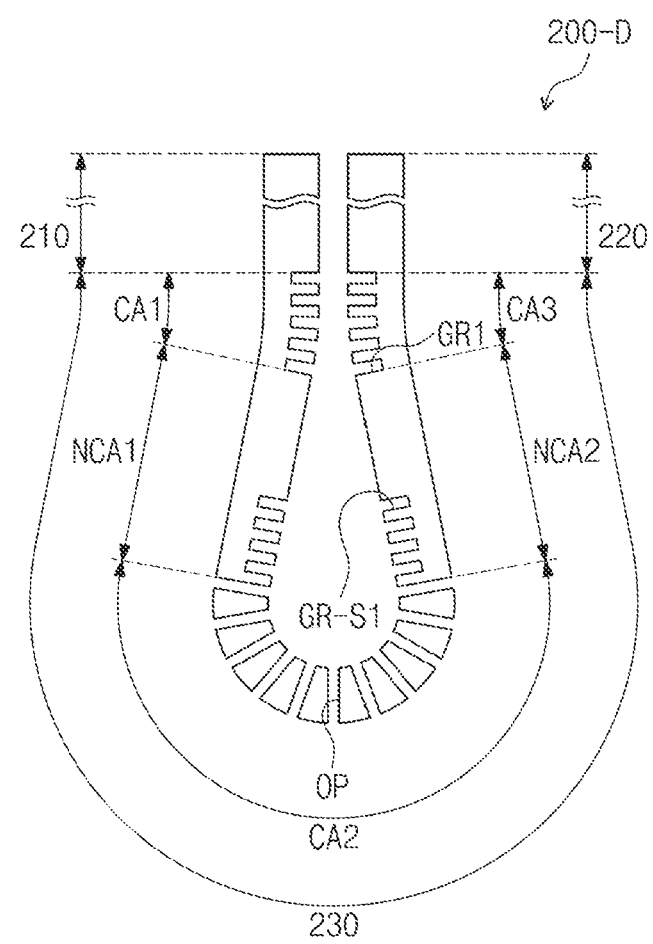
FIG. 9B is a cross-sectional view of a folded plate according to an embodiment of the invention.
Figure 9C:
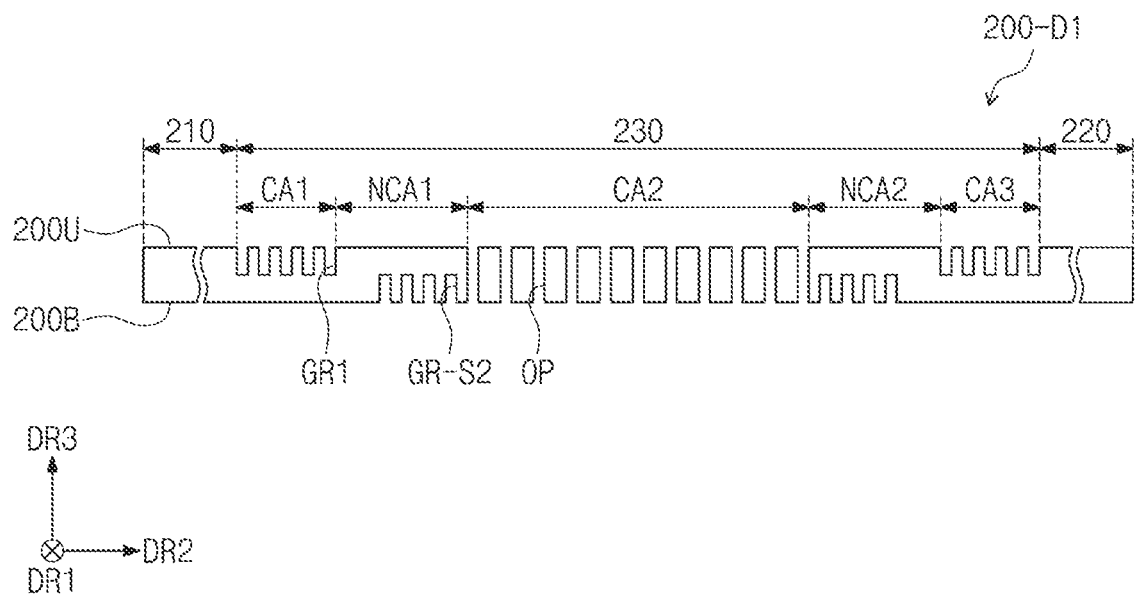
FIG. 9C is a cross-sectional view of an unfolded plate according to an embodiment of the invention.
Figure 9D:
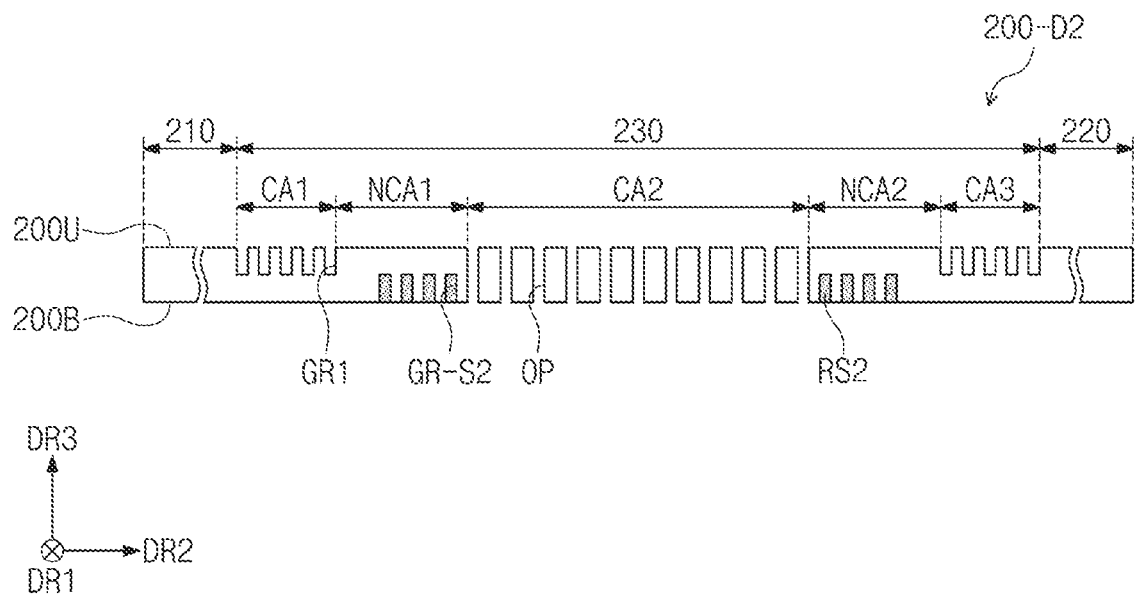
FIG. 9D is a cross-sectional view of an unfolded plate according to an embodiment of the invention.

FIG. 9A is a cross-sectional view of an unfolded plate according to an embodiment of the invention. FIG. 9B is a cross-sectional view of a folded plate according to an embodiment of the invention. FIG. 9C is a cross-sectional view of an unfolded plate according to an embodiment of the invention. FIG. 9D is a cross-sectional view of an unfolded plate according to an embodiment of the invention.

Referring to FIG. 9A and FIG. 9B, a plate 200-D according to an embodiment may include a first surface 200U adjacent to the display module 100 (see FIG. 3) and a second surface 200B facing the first surface 200U.

The plate 200-D includes a first support part 210, a second support part 220, and a folding part 230. The folding part 230 may include a (2-1)-st curved portion CA1, a first flat portion NCA1, a first curved portion CA2, a second flat portion NCA2, and a (2-2)-nd curved portion CA3.

The first curved portion CA2 may include openings OP therein defined to pass through the first surface 200U and the second surface 200B. The openings OP may be arranged apart from each other in the second direction DR2.

According to an embodiment, the (2-1)-st curved portion CA1 and the (2-2)-nd curved portion CA3 may each include first grooves GR1. The first grooves GR1 may be defined by partially recessing the plate 200-D, in the third direction DR3, from the respective first surfaces 200U of the (2-1)-st curved portion CA1 and the 202 curved portion CA3.

According to this embodiment, the first flat portion NCA1 and the second flat portion NCA2 may each include additional upper grooves GR-S1. The additional upper grooves GR-S1 may be defined by partially recessing the plate 200-D, in the third direction DR3, the respective first surfaces 200U of the first flat portion NCA1 and the second flat portion NCA2.

As illustrated in FIG. 9B, in the second mode, tensile stress may be applied to the first surfaces 200U of the (2-1)-st curved portion CA1 and the (2-2)-nd curved portion CA3. As the first grooves GR1 of the (2-1)-st curved portion CA1 and the first grooves GR1 of the (2-2)-nd curved portion CA3 are included, the shape of the first surface 200U of each of the (2-1)-st curved portion CA1 and the (2-2)-nd curved portion CA3 may be easily deformed.

In addition, according to this embodiment, as the first surface 200U of each of the first flat portion NCA1 and the second flat portion NCA2 includes additional upper grooves GR-S1, the shape of one end of the first curved portion CA2 adjacent to the first flat portion NCA1, and the shape of the other end of the first curved portion CA2 adjacent to the second flat portion NCA2 may be easily deformed.

A plurality of upper grooves recessed from the first surface 200U, may define a group of upper grooves. Referring to FIGS. 9A and 9B, the plate 200-D may include a plurality of groups of the upper grooves, and the groups may be spaced apart from each other in a direction along the plate 200-D (or along the first surface 200U). For example, among the plurality of groups of the upper grooves, a first group of upper grooves may be closest to the first curved portion CA2, while a second group of upper grooves may be further from the first curved portion CA2 than the first group of upper grooves.

Referring to FIG. 9C, the first flat portion NCA1 and the second flat portion NCA2 of the plate 200-D1 according to an embodiment may include additional lower grooves GR-S2. The additional lower grooves GR-S2 may be defined by partially recessing the plate 200-D1, in the third direction DR3, from the respective second surfaces 200B of the first flat portion NCA1 and the second flat portion NCA2. Among the plurality of groups of grooves, a group of lower grooves may be closest to the first curved portion CA2, while a group of upper grooves may be further from the first curved portion CA2 than the group of upper grooves.

Referring to FIG. 9D, the first flat portion NCA1 and the second flat portion NCA2 of the plate 200-D2 may each include additional lower grooves GR-S2. The additional lower grooves GR-S2 may be defined by partially recessing the plate 200-D2, in the third direction DR3, from the respective second surfaces 200B of the first flat portion NCA1 and the second flat portion NCA2.

According to an embodiment, the first flat portion NCA1 and the second flat portion NCA2 may each include lower resin patterns RS2 disposed in the additional lower grooves GR-S2. As the lower resin patterns RS2 are disposed in the additional lower grooves GR-S2, sagging of the first curved portion CA2 in the first mode may be prevented. Accordingly, the display module 100 (see FIG. 3) may be safely supported. A lower surface of each of the lower resin patterns RS2 may be coplanar with portions of the second surface 200B adjacent to the additional lower grooves GR-S2, without being limited thereto.

Figure 10A:
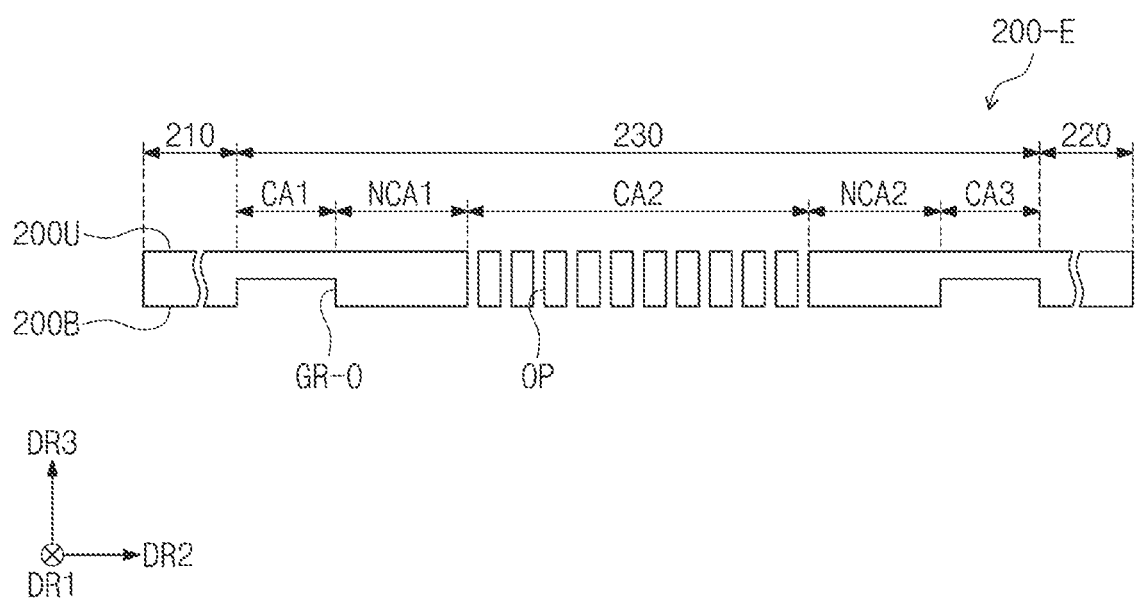
FIG. 10A is a cross-sectional view of an unfolded plate according to an embodiment of the invention.
Figure 10B:
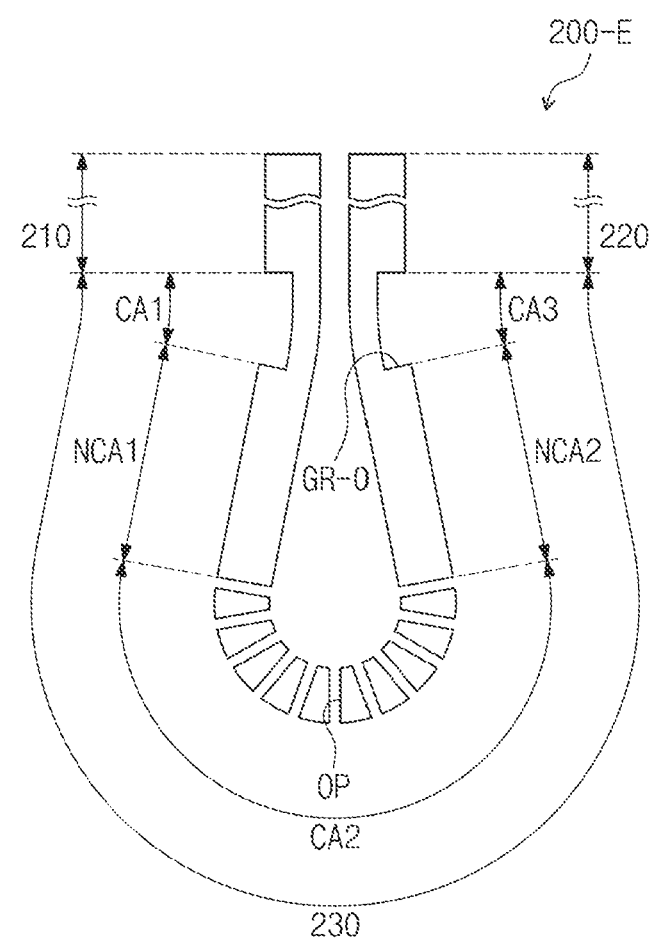
FIG. 10B is a cross-sectional view of a folded plate according to an embodiment of the invention.

FIG. 10A is a cross-sectional view of an unfolded plate according to an embodiment of the invention. FIG. 10B is a cross-sectional view of a folded plate according to an embodiment of the invention.

Referring to FIGS. 10A and 10B, the plate 200-E according to an embodiment may include a first surface 200U adjacent to the display module 100 (see FIG. 3) and a second surface 200B facing the first surface 200U.

The plate 200-E includes a first support part 210, a second support part 220, and a folding part 230. The folding part 230 may include a (2-1)-st curved portion CA1, a first flat portion NCA1, a first curved portion CA2, a second flat portion NCA2, and a (2-2)-nd curved portion CA3.

The first curved portion CA2 may include openings OP therein defined to pass through the first surface 200U and the second surface 200B. The openings OP may be arranged apart from each other in the second direction.

According to an embodiment, the (2-1)-st curved portion CA1 and the (2-1)-st curved portion CA3 may each include one groove GR-0. The groove GR-0 may be defined by partially recessing the plate 200-E, in the third the third direction DR3, from the first surface 200U and across an entire width of each of the (2-1)-st curved portion CA1 and the (2-2)-nd curved portion CA2, in the second direction DR2.

Unlike the embodiment including the plurality of grooves forming a group of grooves described above, the plate 200-E including one groove GR-0 in each of the (2-1)-st curved portion CA1 and the (2-2)-nd curved portion CA3 may include a relatively flexible material compared to plates which includes a plurality of grooves as a group. For example, the plate 200-E according to this embodiment may include a composite material of which may be carbon fiber reinforced plastic (CFRP).

According to one or more embodiment of the invention, when a plate 200 supporting a display module 100 is folded together with folding of the display module 100 to have different curvatures at a folding part 230, stress applied to a region that is folded with a curvature may be reduced because grooves and openings are included in the folding part 230. Accordingly, an electronic device with improved folding properties may be provided.

In the foregoing description, although the embodiments of the invention have been described with reference to embodiments of the invention, it would be understood that various changes and modifications can be made to the invention by one ordinary skilled in the art within the spirit and scope of the invention as hereinafter claimed.

Accordingly, the technical scope of the invention should not be limited to the content described in the detailed description of the specification, but should be defined by the claims.

What is claimed is:

1. A display device comprising:
 a display module including a first non-folding region, a second non-folding region, and a folding region disposed between the first non-folding region and the second non-folding region; and
 a plate disposed below the display module, and including:
  a first surface facing the display module and a second surface opposing the first surface,
  openings completely penetrating a thickness of the plate in a thickness direction of the plate,
  grooves partially penetrating the thickness of the plate and open along the thickness direction of the plate at only one surface among the first surface and the second surface of the plate,
  a folding part which overlaps the folding region and is foldable with respect to a folding axis extending in a first direction, and
  first and second support parts which are spaced apart from each other with the folding part disposed therebetween, wherein the folding part includes:
- a first curved portion which is curved in a direction, and
- second curved portions which are spaced apart from the first curved portion, curved in a direction different from the direction in which the first curved portion is curved, and respectively closer to the first support part and the second support part than the first curved portion, among the openings and the grooves of the plate;
- each of the second curved portions which is respectively closer to the first support part and the second support part than the first curved portion has only the grooves defined therein, and
- the first curved portion has only the openings defined therein.

2. The display device of claim 1, wherein a width of the first curved portion in a second direction crossing the first direction is about two to about four times a width of each of the second curved portions, and
- an area ratio of the second curved portions in the folding part being about 10% to about 35%.

3. The display device of claim 1, wherein
each of the second curved portions has first grooves defined therein among the grooves, the first grooves being recessed from and open at the second surface of the plate.

4. The display device of claim 3, wherein
each of the second curved portions further has second grooves defined therein among the grooves, the second grooves being recessed from and open at the first surface of the plate, and
the second grooves are alternately arranged with the first grooves in a direction along the plate.

5. The display device of claim 4, wherein
a depth of the first grooves from the first surface is about 70% or less of the thickness of the plate, and
a depth of each of the second grooves from the second surface is about 50% or less of the thickness of the plate.

6. The display device of claim 4, wherein
a depth of the first grooves from the first surface is about 50% or less of the thickness of the plate, and
a depth of each of the second grooves from the second surface is about 70% or less of the thickness of the plate.

7. The display device of claim 3, wherein the folding part further includes:
a flat portion which respectively connects the first curved portion to a second curved portion among the second curved portions, at which a change of curvature between the first curved portion and the second curved portion is defined,
an area of the flat portion being without an opening among the openings and without a groove among the grooves,
the first and second support parts are spaced apart from each other with the folding part disposed therebetween along a second direction, and
a width of the area of the flat portion in the second direction is greater than a width of plate portions respectively between the openings defined in the first curved portion.

8. The display device of claim 7, wherein
the flat portion of the folding part includes additional grooves among the grooves, the additional grooves being adjacent to the area of the flat portion which is without the opening and without the groove and being open only at the first surface or the second surface of the plate, and
the additional grooves and the first grooves are recessed from and open at the same surface among the first surface and the second surface of the plate.

9. The display device of claim 8, further comprising resin patterns disposed in the additional grooves.

10. The display device of claim 7, wherein
the flat portion of the folding part includes additional grooves among the grooves, the additional grooves being adjacent to the area of the flat portion which is without the opening and without the groove and being open only at the first surface or the second surface of the plate, and
the additional grooves and the first grooves are recessed from and open at different surfaces among the first surface and the second surface of the plate.

11. The display device of claim 10, further comprising resin patterns disposed in the additional grooves.

12. The display device of claim 1, wherein the each of the second curved portions comprises:
one first groove open only at a first surface of the folding part and a thickness portion of the plate which is maintained at the second surface and overlaps the one first groove, and
the one first groove respectively extending across an entire width of each of the second curved portions.

13. The display device of claim 1, wherein the plate comprises either of stainless steel or a reinforced fiber composite material.

14. The display device of claim 1, wherein a curvature of the first curved portion is greater than a curvature of the second curved portions.

15. The display device of claim 1, wherein the thickness of the plate is about 80 μm to about 200 μm.

* * * * *